US012283246B2

(12) United States Patent
Lu et al.

(10) Patent No.: US 12,283,246 B2
(45) Date of Patent: Apr. 22, 2025

(54) ORGANIC LIGHT EMITTING DIODE DISPLAY SUBSTRATE AND PREPARATION METHOD THEREOF, AND ORGANIC LIGHT EMITTING DIODE DISPLAY APPARATUS

(71) Applicant: BOE Technology Group Co., Ltd., Beijing (CN)

(72) Inventors: Jiangnan Lu, Beijing (CN); Guangliang Shang, Beijing (CN); Libin Liu, Beijing (CN); Li Wang, Beijing (CN); Xinshe Yin, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 290 days.

(21) Appl. No.: 17/636,898

(22) PCT Filed: Mar. 24, 2021

(86) PCT No.: PCT/CN2021/082655
§ 371 (c)(1),
(2) Date: Feb. 21, 2022

(87) PCT Pub. No.: WO2022/198487
PCT Pub. Date: Sep. 29, 2022

(65) Prior Publication Data
US 2023/0351970 A1 Nov. 2, 2023

(51) Int. Cl.
G09G 3/3266 (2016.01)
G11C 19/28 (2006.01)

(52) U.S. Cl.
CPC ... *G09G 3/3266* (2013.01); *G09G 2300/0426* (2013.01); *G09G 2310/0286* (2013.01); *G11C 19/28* (2013.01)

(58) Field of Classification Search
CPC ......... G09G 3/3266; G09G 2300/0426; G09G 2310/0286; G09G 3/36; G11C 19/28; H01L 27/124; H01L 27/1255
See application file for complete search history.

(56) References Cited

U.S. PATENT DOCUMENTS

2015/0116008 A1    4/2015  Jang et al.
2016/0329015 A1*  11/2016  Ji ............................. G09G 3/32
(Continued)

FOREIGN PATENT DOCUMENTS

CN    101329948 A    12/2008
CN    103424097 A    12/2013
(Continued)

*Primary Examiner* — David D Davis
(74) *Attorney, Agent, or Firm* — Ling Wu; Stephen Yang; Ling and Yang Intellectual Property

(57) ABSTRACT

Provided is a display substrate including a display region and a non-display region. The non-display region is provided with a gate drive circuit, and the gate drive circuit includes a plurality of cascaded shift register units; a shift register unit includes an input sub-circuit and a denoising output sub-circuit. The denoising output sub-circuit is connected with the input sub-circuit, a first group of clock signal lines, and a second group of clock signal lines, and the input sub-circuit is connected with a third group of clock signal lines. The third group of clock signal lines, the input sub-circuit, the first group of clock signal lines, the denoising output sub-circuit, and the second group of clock signal lines are sequentially arranged along a first direction.

19 Claims, 13 Drawing Sheets

(56) References Cited

U.S. PATENT DOCUMENTS

| | | | |
|---|---|---|---|
| 2017/0004760 A1* | 1/2017 | Jang | G09G 3/3677 |
| 2017/0249916 A1 | 8/2017 | Jen et al. | |
| 2018/0046311 A1* | 2/2018 | Gu | G06F 3/04184 |
| 2018/0204521 A1* | 7/2018 | Gu | G09G 3/3677 |
| 2019/0206503 A1* | 7/2019 | Zhang | G09G 3/20 |
| 2019/0392916 A1* | 12/2019 | Gu | G09G 3/20 |
| 2020/0020266 A1* | 1/2020 | Feng | G11C 19/28 |
| 2020/0052005 A1 | 2/2020 | Yoshida | |
| 2020/0286941 A1* | 9/2020 | Fukuoka | H04N 25/70 |
| 2021/0082328 A1* | 3/2021 | Feng | G09G 3/3266 |
| 2021/0193027 A1* | 6/2021 | Zheng | G09G 3/3266 |

FOREIGN PATENT DOCUMENTS

| | | | | |
|---|---|---|---|---|
| CN | 104575350 A | | 4/2015 | |
| CN | 106328063 A | * | 1/2017 | G02F 1/1345 |
| CN | 107134264 A | | 9/2017 | |
| CN | 108682398 A | * | 10/2018 | G09G 3/20 |
| CN | 110326037 A | | 10/2019 | |
| CN | 111415624 A | | 7/2020 | |
| EP | 3836133 A1 | * | 6/2021 | G09G 3/20 |
| KR | 1020090009475 A | | 1/2009 | |
| KR | 1020090114767 A | | 11/2009 | |

* cited by examiner

ORGANIC LIGHT EMITTING DIODE DISPLAY SUBSTRATE AND PREPARATION METHOD THEREOF, AND ORGANIC LIGHT EMITTING DIODE DISPLAY APPARATUS

CROSS-REFERENCE TO RELATED APPLICATIONS

The present application is a U.S. National Phase Entry of International Application No. PCT/CN2021/082655 having an international filing date of Mar. 24, 2021. The above-identified application is incorporated into the present application by reference.

TECHNICAL FIELD

The present disclosure relates to, but is not limited to, the field of display technologies, and particularly to a display substrate and a preparation method thereof, and a display apparatus.

BACKGROUND

An Organic Light Emitting Diode (OLED) with advantages of ultra-thin design, large field of view, active emission, high brightness, continuous and adjustable light colors, low cost, quick response, low power consumption, wide working temperature range, flexible display, and the like, has gradually become a next-generation display technology with a broad development prospect and attracted more and more attention. The OLED may be divided into a Passive Matrix (PM) type and an Active Matrix (AM) type according to different drive modes. An AMOLED is a current-driven device and controls each sub-pixel using an independent Thin Film Transistor (TFT), and each sub-pixel may be continuously and independently driven to emit light.

SUMMARY

The following is a summary about the subject matter described in the present disclosure in detail. The summary is not intended to limit the scope of protection of claims.

Embodiments of the present disclosure provide a display substrate and a preparation method thereof, and a display apparatus.

In one aspect, an embodiment of the present disclosure provides a display substrate, including a display region and a non-display region. The non-display region is provided with a gate drive circuit including a plurality of cascaded shift register units. A shift register unit includes an input sub-circuit and a denoising output sub-circuit. The denoising output sub-circuit is connected with the input sub-circuit, a first group of clock signal lines, and a second group of clock signal lines, and the input sub-circuit is connected with a third group of clock signal lines. The third group of clock signal lines, the input sub-circuit, the first group of clock signal lines, the denoising output sub-circuit, and the second group of clock signal lines are sequentially arranged along a first direction.

In some exemplary embodiments, the denoising output sub-circuit includes a denoising control unit; the first group of clock signal lines includes a first clock signal line and a second clock signal line. The denoising control unit at least includes a first transistor, a second transistor, a first capacitor, and a second capacitor. A control electrode and a first electrode of the first transistor are connected with a second denoising control node, and a second electrode of the first transistor is connected with a first denoising control node. A control electrode of the second transistor is connected with the first clock signal line, a first electrode of the second transistor is connected with a first power supply line, and a second electrode of the second transistor is connected with the second denoising control node. A first electrode of the first capacitor is connected with the second denoising control node, and a second electrode of the first capacitor is connected with the second clock signal line. A first electrode of the second capacitor is connected with the first denoising control node, and a second electrode of the second capacitor is connected with the first power supply line. The first capacitor is adjacent to the first transistor, and the second capacitor is adjacent to the first transistor.

In some exemplary embodiments, the second transistor is located on a side of the first capacitor away from the first transistor.

In some exemplary embodiments, the first capacitor and the second capacitor are located on opposite sides of the first transistor in the first direction, and the first clock signal line, the second clock signal line, and the first power supply line all extend along a second direction, and the first direction and the second direction are intersected.

In some exemplary embodiments, an active layer of the first transistor extends along the first direction and an active layer of the second transistor extends along the second direction.

In some exemplary embodiments, the first clock signal line is located on a side of the second clock signal line away from the input sub-circuit.

In some exemplary embodiments, the denoising control unit further includes a third transistor and a fourth transistor. A control electrode of the third transistor is connected with a first output terminal of the input sub-circuit, a first electrode of the third transistor is connected with the second power supply line, and a second electrode of the third transistor is connected with the second denoising control node. A control electrode of the fourth transistor is connected with the first output terminal of the input sub-circuit, a first electrode of the fourth transistor is connected with the second power supply line, and a second electrode of the fourth transistor is connected with the first denoising control node. The third transistor and the fourth transistor are located on a side of the second transistor away from the first capacitor.

In some exemplary embodiments, an extending direction of an active layer of the fourth transistor, an extending direction of an active layer of the third transistor, and an extending direction of an active layer of the second transistor are parallel to each other.

In some exemplary embodiments, the control electrode of the third transistor and the control electrode of the fourth transistor form an integrated structure, and the active layer of the third transistor and the active layer of the second transistor form an integrated structure.

In some exemplary embodiments, in a direction perpendicular to the display substrate, the display substrate includes: a base substrate, and a semiconductor layer, a first conductive layer, a second conductive layer, a third conductive layer, and a fourth conductive layer that are arranged on the base substrate. The semiconductor layer at least includes active layers of the first transistor to fourth transistor. The first conductive layer at least includes control electrodes of the first transistor to fourth transistor, a first sub-electrode of the first capacitor, and a first sub-electrode of the second capacitor. The second conductive layer at least includes a second sub-electrode of the first capacitor and a second sub-electrode of the second capacitor. The third conductive layer at least includes a third sub-electrode of the first capacitor, a third sub-electrode of the second capacitor, first electrode and second electrode of the first transistor to fourth transistor, a first connection line, a second connection line, and a third connection line. The fourth conductive layer at least includes a fourth sub-electrode of the first capacitor, a fourth sub-electrode of the second capacitor, the first clock signal line connected with the first connection line, the second clock signal line connected with the second connection line, and the first power supply line connected with the third connection line. The first sub-electrode and the third sub-electrode of the first capacitor are connected as a first electrode of the first capacitor, and the second sub-electrode and the fourth sub-electrode of the first capacitor are connected as a second electrode of the first capacitor. The first sub-electrode and the third sub-electrode of the second capacitor are connected as a first electrode of the second capacitor, and the second sub-electrode and the fourth sub-electrode of the second capacitor are connected as a second electrode of the second capacitor.

In some exemplary embodiments, the control electrode of the first transistor and the first sub-electrode of the first capacitor form an integrated structure, the first electrode of the first transistor and the third sub-electrode of the first capacitor form an integrated structure, and the second electrode of the first transistor and the third sub-electrode of the second capacitor form an integrated structure.

In some exemplary embodiments, the fourth sub-electrode of the second capacitor and the first power supply line are of an integral structure.

In some exemplary embodiments, the denoising output sub-circuit further includes an output unit; and the second group of clock signal lines includes a fifth clock signal line. The output unit at least includes a fifth transistor and a sixth transistor. A control electrode of the fifth transistor is connected with the first denoising control node, a first electrode of the fifth transistor is connected with the first power supply line, and a second electrode of the fifth transistor is connected with a second output terminal. A control electrode of the sixth transistor is connected with the input sub-circuit, a first electrode of the sixth transistor is connected with a fifth clock signal line, and a second electrode of the sixth transistor is connected with the second output terminal. The fifth transistor and the sixth transistor are located between the fourth transistor and the second capacitor.

In some exemplary embodiments, the display substrate is provided with at least a first first power supply line and a second first power supply line, wherein the first first power supply line is connected with the denoising output sub-circuit, and the second first power supply line is connected with the input sub-circuit; the first first power supply line is located on a side of the second capacitor away from the first transistor, and the fifth clock signal line is located on a side of the first first power supply line away from the second capacitor.

In some exemplary embodiments, the first electrode and the control electrode of the first transistor are connected, and an orthogonal projection of the first electrode of the first transistor on the base substrate is not overlapped with an orthogonal projection of a channel region of the active layer of the first transistor on the base substrate.

In another aspect, an embodiment of the present disclosure provides a display apparatus, which includes the aforementioned display substrate.

In another aspect, an embodiment of the present disclosure provides a preparation method for a display substrate, used for preparing the aforementioned display substrate, and the preparation method includes: providing a base substrate; and forming a gate drive circuit in a non-display region. The gate drive circuit includes a plurality of cascaded shift register units; the shift register unit includes an input sub-circuit and a denoising output sub-circuit. The denoising output sub-circuit is connected with the input sub-circuit, a first group of clock signal lines, and a second group of clock signal lines, and the input sub-circuit is connected with a third group of clock signal lines. The third group of clock signal lines, the input sub-circuit, the first group of clock signal lines, the denoising output sub-circuit, and the second group of clock signal lines are sequentially arranged along a first direction.

In some exemplary embodiments, the denoising output sub-circuit includes a denoising control unit; the first group of clock signal lines includes a first clock signal line and a second clock signal line. The denoising control unit at least includes a first transistor, a second transistor, a third transistor, a fourth transistor, a first capacitor, and a second capacitor.

A control electrode and a first electrode of the first transistor are connected with a second denoising control node, and a second electrode of the first transistor is connected with a first denoising control node.

A control electrode of the second transistor is connected with the first clock signal line, a first electrode of the second transistor is connected with a first power supply line, and a second electrode of the second transistor is connected with the second denoising control node.

A first electrode of the first capacitor is connected with the second denoising control node, and a second electrode of the first capacitor is connected with the second clock signal line. A first electrode of the second capacitor is connected with the first denoising control node, and a second electrode of the second capacitor is connected with the first power supply line. The first capacitor and the second capacitor are located on opposite sides of the first transistor, and the second transistor is located on a side of the first capacitor away from the first transistor.

A control electrode of the third transistor is connected with a first output terminal of the input sub-circuit, a first electrode of the third transistor is connected with a second power supply line, and a second electrode of the third transistor is connected with the second denoising control node.

A control electrode of the fourth transistor is connected with the first output terminal, a first electrode of the fourth transistor is connected with the second power supply line, and a second electrode of the fourth transistor is connected with the first denoising control node.

Forming the aforementioned gate drive circuit includes:
  forming sequentially a first insulating layer and a semiconductor layer on the base substrate, herein the semiconductor layer at least includes active layers of the first transistor to fourth transistor;
  forming sequentially a second insulating layer and a first conductive layer, herein the first conductive layer at least includes the control electrodes of the first transistor to fourth transistor, a first sub-electrode of the first capacitor and a first sub-electrode of the second capacitor;
  forming sequentially a third insulating layer and a second conductive layer, herein the second conductive layer at least includes a second sub-electrode of the first capacitor and a second sub-electrode of the second capacitor;

forming sequentially a fourth insulating layer and a third conductive layer, herein the third conductive layer at least includes a third sub-electrode of the first capacitor, a third sub-electrode of the second capacitor, the first electrode and second electrode of the first transistor to fourth transistor, a first connection line, a second connection line, and a third connection line; and forming sequentially a fifth insulating layer, a sixth insulating layer, and a fourth conductive layer, herein the fourth conductive layer at least includes a fourth sub-electrode of the first capacitor, a fourth sub-electrode of the second capacitor, the first clock signal line connected with the first connection line, the second clock signal line connected with the second connection line, and the first power supply line connected with the third connection line.

The first sub-electrode and the third sub-electrode of the first capacitor are connected as a first electrode of the first capacitor, and the second sub-electrode and the fourth sub-electrode of the first capacitor are connected as a second electrode of the first capacitor. The first sub-electrode and the third sub-electrode of the second capacitor are connected as a first electrode of the second capacitor, and the second sub-electrode and the fourth sub-electrode of the second capacitor are connected as a second electrode of the second capacitor.

After reading and understanding the drawings and the detailed description, other aspects may be understood.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
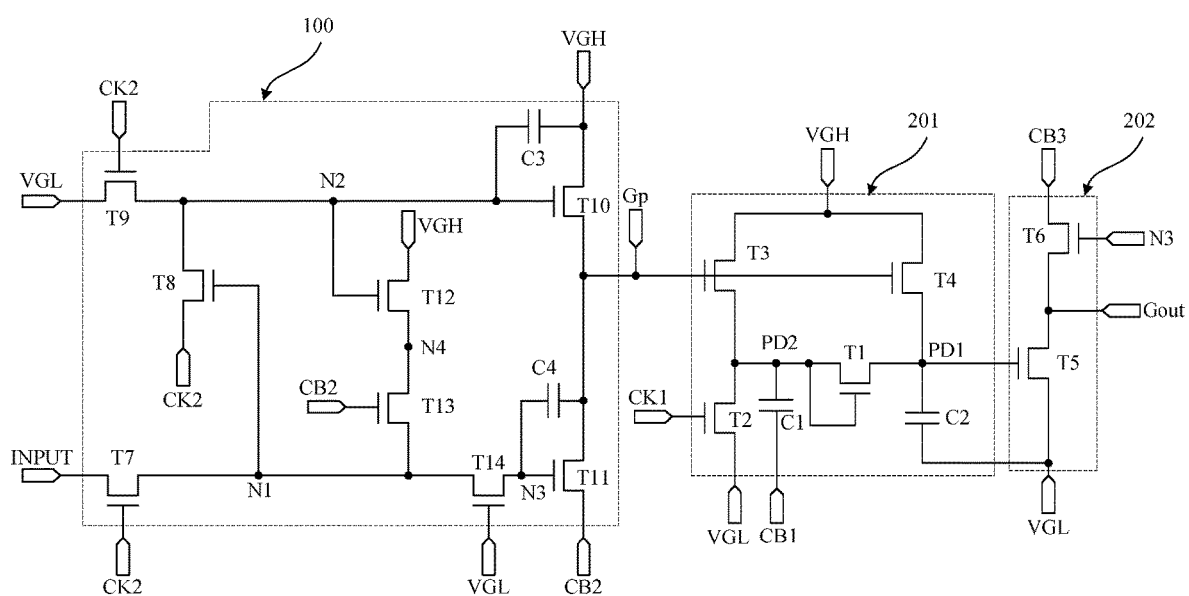
FIG. 1 is an equivalent circuit diagram of a shift register unit according to at least one embodiment of the present disclosure.

The embodiments of the present disclosure will be described below in combination with the drawings in detail. The embodiments may be implemented in various forms. Those of ordinary skill in the art may easily understand such a fact that manners and contents may be transformed into one or more forms without departing from the purpose and scope of the present disclosure. Therefore, the present disclosure should not be explained as being limited to the contents recorded in the following implementations only. The embodiments in the present disclosure and features in the embodiments may be combined with each other arbitrarily in a case of no conflict.

In the drawings, the size/sizes of one or more composition elements, the thicknesses of layers, or regions are exaggerated sometimes for clarity. Therefore, an implementation of the present disclosure is not necessarily limited to the size shown, and the shape and size of one or more components in the drawings do not reflect true proportions. In addition, the drawings schematically illustrate ideal examples, and a mode of the present disclosure is not limited to the shapes, numerical values, or the like shown in the drawings.

Ordinal numerals "first", "second", and "third" in the present disclosure are set not to form limits in number but only to avoid the confusion of composition elements. In the present disclosure, "a plurality of" represents two or more than two.

In the present disclosure, for convenience, expressions "central", "above", "below", "front", "back", "vertical", "horizontal", "top", "bottom", "inside", "outside", etc., indicating orientation or positional relationships are used to illustrate positional relationships between the composition elements referring to the drawings, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where the composition elements are described. Therefore, appropriate replacements based on situations are allowed, not limited to the expressions in the specification.

In the present disclosure, unless otherwise specified and defined, terms "mounting", "mutual connection", and "connection" should be generally understood. For example, it may be fixed connection, removable connection, or integrated connection; it may be mechanical connection or electrical connection; it may be direct connection, indirect connection through an intermediate component, or communication inside two components. For those skilled in the art, the meanings of the above terms in the present disclosure may be understood according to the situation. Herein, "electric connection" includes connection of the composition elements through an element with a certain electric action. "The element with the certain electric action" is not particularly limited as long as electric signals between the connected composition elements may be sent and received. Examples of "the element with the certain electric action" not only include an electrode and a line, but also include a switch element such as a transistor, a resistor, an inductor, a capacitor, another element with one or more functions, etc.

In the present disclosure, the transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source electrode. In the present disclosure, the channel region refers to a region through which a current mainly flows.

In the present disclosure, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchangeable in the present disclosure.

In the present disclosure, "parallel" refers to a state that an angle formed by two straight lines is larger than −10° and smaller than 10°, and thus may include a state that the angle is larger than −5° and smaller than 5°. In addition, "perpendicular" refers to a state that an angle formed by two straight lines is larger than 80° and smaller than 100°, and thus may include a state that the angle is larger than 85° and smaller than 95°.

In the present disclosure, "film" and "layer" may be exchanged. For example, sometimes "conducting layer" may be replaced by "conducting film". Similarly, sometimes "insulating film" may be replaced by "insulating layer".

In the present disclosure, "about" and "approximate" refer to that a boundary is defined not so strictly and situations in process and measurement error ranges are allowed.

At least one embodiment of the present disclosure provides a display substrate, including a display region and a non-display region. The non-display region is provided with a gate drive circuit which includes a plurality of cascaded shift register units. The shift register unit includes an input sub-circuit and a denoising output sub-circuit. The denoising output sub-circuit is connected with the input sub-circuit, a first group of clock signal lines, and a second group of clock signal lines, and the input sub-circuit is connected with a third group of clock signal lines. The third group of clock signal lines, the input sub-circuit, the first group of clock signal lines, the denoising output sub-circuit, and the second group of clock signal lines are sequentially arranged along a first direction. In other words, in the first direction, the first group of clock signal lines is located between the input sub-circuit and the denoising output sub-circuit, the second group of clock signal lines is located on a side of the denoising output sub-circuit away from the first group of clock signal lines, and the third group of clock signal lines is located on a side of the input sub-circuit away from the second group of clock signal lines.

According to the display substrate in this embodiment, by arranging the input sub-circuit, the denoising output sub-circuit, and three groups of clock signal lines at intervals, layout density of the shift register unit may be improved, and a narrow frame may be achieved. Furthermore, load on a clock signal line may be reduced and performance of the shift register unit may be improved.

In some exemplary embodiments, the denoising output sub-circuit includes a denoising control unit. The first group of clock signal lines includes a first clock signal line and a second clock signal line. The denoising control unit at least includes a first transistor, a second transistor, a first capacitor, and a second capacitor. A control electrode and a first electrode of the first transistor are connected with a second denoising control node, and a second electrode of the first transistor is connected with a first denoising control node. A control electrode of the second transistor is connected with the first clock signal line, a first electrode of the second transistor is connected with a first power supply line, and a second electrode of the second transistor is connected with the second denoising control node. A first electrode of the first capacitor is connected with the second denoising control node, and a second electrode of the first capacitor is connected with the second clock signal line. A first electrode of the second capacitor is connected with the first denoising control node, and a second electrode of the second capacitor is connected with the first power supply line. The first capacitor is adjacent to the first transistor, and the second capacitor is adjacent to the first transistor. For example, the first capacitor and the second capacitor may be located on a same side of the first transistor, or the first capacitor and the second capacitor may be located on opposite sides of the first transistor respectively. However, this embodiment is not limited to this.

In this exemplary embodiment, by arranging the first transistor, the second transistor, the first capacitor, and the second capacitor in the shift register unit to form a charge pump structure, and arranging the first capacitor and the second capacitor adjacent to the first transistor, layout density of the shift register unit may be improved, and a narrow bezel may be achieved.

In some exemplary embodiments, the first clock signal line and the second clock signal line are located between the input sub-circuit and the denoising control unit, which may minimize load of the first clock signal line and the second clock signal line, which is beneficial to reduce durations of a rising edge and a falling edge of the shift register unit, thereby improving performance of the shift register unit.

In some exemplary embodiments, the second transistor is located on a side of the first capacitor away from the first transistor.

In some exemplary embodiments, the first capacitor and the second capacitor are located on opposite sides of the first transistor in the first direction, and the first clock signal line, the second clock signal line, and the first power supply line all extend along a second direction. The first direction and the second direction intersect. For example, the first direction may be perpendicular to the second direction.

In some exemplary embodiments, an active layer of the first transistor extends along the first direction and an active layer of the second transistor extends along the second direction. In this example, an extending direction of the active layer of the second transistor may be parallel to extending directions of the first clock signal line and the second clock signal line, and an extending direction of the active layer of the first transistor may cross the extending directions of the first clock signal line and the second clock signal line. However, this embodiment is not limited to this.

In some exemplary embodiments, the first clock signal line is located on a side of the second clock signal line away from the input sub-circuit. In this example, the first clock signal line is close to the denoising output sub-circuit, and the second clock signal line is close to the input sub-circuit. However, this embodiment is not limited to this. For example, the second clock signal line may be located on a side of the first clock signal line away from the input sub-circuit.

In some exemplary embodiments, the denoising control unit may further include a third transistor and a fourth transistor. A control electrode of the third transistor is connected with a first output terminal of the input sub-circuit, a first electrode of the third transistor is connected with a second power supply line, and a second electrode of the third transistor is connected with the second denoising control node. A control electrode of the fourth transistor is connected with the first output terminal of the input sub-circuit, a first electrode of the fourth transistor is connected with the second power supply line, and a second electrode of the fourth transistor is connected with the first denoising control node. The third transistor and the fourth transistor are located on a side of the second transistor away from the first capacitor. For example, the third transistor and the fourth transistor are arranged side by side along the first direction, and the third transistor and the second transistor are arranged sequentially along the second direction. However, this embodiment is not limited to this.

In some exemplary embodiments, an extending direction of an active layer of the fourth transistor, an extending direction of an active layer of the third transistor, and an extending direction of the active layer of the second transistor are parallel to each other. For example, active layers of the fourth transistor, the third transistor, and the second transistor all extend along the second direction.

In some exemplary embodiments, the control electrode of the third transistor and the control electrode of the fourth transistor may be of an integrated structure, and the active layer of the third transistor and the active layer of the second transistor may be of an integrated structure.

In some exemplary embodiments, in a direction perpendicular to the display substrate, the display substrate includes: a base substrate, and a semiconductor layer, a first conductive layer, a second conductive layer, a third conductive layer, and a fourth conductive layer that are arranged on the base substrate. The semiconductor layer at least includes active layers of the first transistor to fourth transistor. The first conductive layer at least includes control electrodes of the first transistor to fourth transistor, a first sub-electrode of the first capacitor, and a first sub-electrode of the second capacitor. The second conductive layer at least includes a second sub-electrode of the first capacitor and a second sub-electrode of the second capacitor. The third conductive layer at least includes a third sub-electrode of the first capacitor, a third sub-electrode of the second capacitor, first electrodes and second electrodes of the first transistor to fourth transistor, a first connection line, a second connection line, and a third connection line. The fourth conductive layer at least includes a fourth sub-electrode of the first capacitor, a fourth sub-electrode of the second capacitor, the first clock signal line connected with the first connection line, the second clock signal line connected with the second connection line, and the first power supply line connected with the third connection line. The first sub-electrode and the third sub-electrode of the first capacitor are connected as a first electrode of the first capacitor, and the second sub-electrode and the fourth sub-electrode of the first capacitor are connected as a second electrode of the first capacitor. The first sub-electrode and the third sub-electrode of the second capacitor are connected as a first electrode of the second capacitor, and the second sub-electrode and the fourth sub-electrode of the second capacitor are connected as a second electrode of the second capacitor. In this exemplary embodiment, a four-stacked structure may be adopted for the first capacitor and the second capacitor. However, this embodiment is not limited to this.

In some exemplary embodiments, the control electrode of the first transistor and the first sub-electrode of the first capacitor form an integrated structure, the first electrode of the first transistor and the third sub-electrode of the first capacitor form an integrated structure, and the second electrode of the first transistor and the third sub-electrode of the second capacitor form an integrated structure.

In some exemplary embodiments, the fourth sub-electrode of the second capacitor and the first power supply line form an integral structure.

In some exemplary embodiments, the denoising output sub-circuit further includes an output unit. The second group of clock signal lines includes a fifth clock signal line. The output unit at least includes a fifth transistor and a sixth transistor. A control electrode of the fifth transistor is connected with the first denoising control node, a first electrode of the fifth transistor is connected with the first power supply line, and a second electrode of the fifth transistor is connected with a second output terminal. A control electrode of the sixth transistor is connected with the input sub-circuit, a first electrode of the sixth transistor is connected with a fifth clock signal line, and a second electrode of the sixth transistor is connected with the second output terminal. The fifth transistor and the sixth transistor are located between the fourth transistor and the second capacitor.

In some exemplary embodiments, the display substrate is provided with at least a first first power supply line and a second first power supply line, the first first power supply line is connected with the denoising output sub-circuit, and the second first power supply line is connected with the input sub-circuit. The first first power supply line is located on a side of the second capacitor away from the first transistor, and the fifth clock signal line is located on a side of the first first power supply line away from the second capacitor.

In some exemplary embodiments, the first electrode and the control electrode of the first transistor are connected, and an orthogonal projection of the first electrode of the first transistor on the base substrate is not overlapped with an orthogonal projection of a channel region of the active layer of the first transistor on the base substrate. In this exemplary embodiment, a punching position for achieving connection between the first electrode and the control electrode is arranged to avoid the channel region of the active layer of the first transistor, thereby preventing the channel region of the active layer of the first transistor from being damaged.

Solutions of the embodiments will be described below through some examples.

In some exemplary embodiments, the display substrate may include: a display region and a non-display region. For example, the non-display region may be located at a periphery of the display region. However, this embodiment is not limited to this. The display region at least includes a plurality of regularly arranged pixel units, a plurality of gate lines (for example, including a scanning line, a reset signal line, and a light emitting control line) extending along a first direction, a plurality of data lines and a power supply line extending along a second direction. The first direction and the second direction are in a same plane, and the first direction is perpendicular to the second direction.

In some exemplary embodiments, a pixel unit in the display region may include three sub-pixels, and the three sub-pixels may be a red sub-pixel, a green sub-pixel, and a blue sub-pixel respectively. However, this embodiment is not limited to this. In some examples, a pixel unit may include four sub-pixels, and the four sub-pixels may be a red sub-pixel, a green sub-pixel, a blue sub-pixel, and a white sub-pixel respectively.

In some exemplary embodiments, a shape of the sub-pixel may be a rectangle, a rhombus, a pentagon, or a hexagon. When a pixel unit includes three sub-pixels, the three sub-pixels may be arranged in parallel in a horizontal direction, in parallel in a vertical direction, or in a form of delta-shaped. When a pixel unit includes four sub-pixels, the four sub-pixels may be arranged in parallel in a horizontal direction, in parallel in a vertical direction, or in a square. However, this embodiment is not limited to this.

In some exemplary embodiments, a timing controller, a data drive circuit, and a gate drive circuit may be arranged in the non-display region. The gate drive circuit may be arranged on two opposite sides of the display region respectively, such as left and right sides of the display region. The timing controller and the data drive circuit may be arranged on a side of the display region, such as a lower side of the display region. However, this embodiment is not limited to this.

In some exemplary embodiments, the data drive circuit may provide a data signal to a sub-pixel through a data line. The gate drive circuit may provide a scanning signal to a sub-pixel through a scanning line, provide a reset signal to a sub-pixel through a reset signal line, and provide a light emitting control signal to a sub-pixel through a light emitting control line. The timing controller may provide drive signals to the data drive circuit and the gate drive circuit. Actions of the gate drive circuit and the data drive circuit may be controlled by the timing controller. The timing controller may provide gray scale data specifying a gray scale that should be displayed at a sub-pixel to the data drive circuit. The data drive circuit may provide a data signal of a potential corresponding to the gray scale data of the sub-pixel to sub-pixels of a row selected by the gate drive circuit via a data line.

In some exemplary embodiments, the pixel drive circuit may have a structure of a 3T1C, 4T1C, 5T1C, 5T2C, 6T1C, or 7T1C. However, this embodiment is not limited to this.

In some exemplary embodiments, the gate drive circuit further includes a plurality of cascaded shift register units. For example, an input terminal of a first stage shift register unit may be connected with an initial signal line, and a first output terminal of an n-th stage shift register unit may be connected with an input terminal of an (n+1)-th stage shift register unit to provide an input signal to the (n+1)-th stage shift register unit, n being an integer greater than 0. A second output terminal of a shift register unit may provide a scanning signal to a sub-pixel through a scanning line and provide a reset signal to the sub-pixel through a reset signal line. For example, an output signal provided by the second output terminal of the shift register unit may be configured to control turning on of a P-type transistor (for example, a low-temperature polysilicon thin film transistor) or an N-type transistor (for example, an oxide thin film transistor) in a pixel circuit. However, this embodiment is not limited to this.

FIG. 1 is an equivalent circuit diagram of a shift register unit according to at least one embodiment of the present disclosure. The shift register unit provided in this exemplary embodiment may be configured to provide a scanning signal to a sub-pixel through a scanning line and provide a reset signal to the sub-pixel through a reset signal line. As shown in FIG. 1, the shift register unit provided in this exemplary embodiment includes an input sub-circuit 100 and a denoising output sub-circuit. The denoising output sub-circuit includes a denoising control unit 201 and an output unit 202. The denoising control unit 201 is connected with a first output terminal Gp, a first clock signal line CK1, a second clock signal line CB1, a first power supply line VGL, a second power supply line VGH, and a first denoising control node PD1. The denoising control unit 201 is configured to rectify charge of the first power supply line VGL to the first denoising control node PD1 under control of the first clock signal line CK1, so as to keep a voltage of the first denoising control node PD1 at a voltage at which a denoising subunit of the output unit 202 is turned on; and transmit a signal of the second power supply line VGH to the first denoising control node PD1 under control of the first output terminal Gp, so as to keep a voltage of the first denoising control node PD1 at a voltage at which the denoising subunit of the output unit 202 is turned off.

The input sub-circuit 100 is connected with a third clock signal line CK2, a fourth clock signal line CB2, an input terminal INPUT, the first power supply line VGL, the second power supply line VGH, the first output terminal Gp, and the output unit 202. The input sub-circuit 100 is configured to write a signal of the input terminal INPUT under control of the third clock signal line CK2, and transmit a turn-on signal to the output unit 202 according to the written signal under control of the first power supply line VGL.

The output unit 202 is connected with a fifth clock signal line CB3, the first power supply line VGL, the first denoising control node PD1, a second output terminal Gout, and the input sub-circuit 100. The output unit 202 is configured to transmit a signal of the fifth clock signal line CB3 to the second output terminal Gout under control of the turn-on signal transmitted by the input sub-circuit 100, and to transmit a signal of the first power supply line VGL to the second output terminal Gout under control of the first denoising control node PD1.

In this exemplary embodiment, the first group of clock signal lines includes the first clock signal line CK1 and the second clock signal line CB1, the second group of clock signal lines includes the fifth clock signal line CB3, and the third group of clock signal lines includes the third clock signal line CK2 and the fourth clock signal line CB2.

In this exemplary embodiment, by providing the denoising control unit, it is possible to continuously denoise the second output terminal of the shift register unit, thereby improving display stability.

In some exemplary embodiments, as shown in FIG. 1, the denoising control unit 201 includes: a first transistor T1, a second transistor T2, a third transistor T3, a fourth transistor T4, a first capacitor C1, and a second capacitor C2. A control electrode and a first electrode of the first transistor T1 are connected with a second denoising control node PD2, and a second electrode of the first transistor T1 is connected with the first denoising control node PD1. A control electrode of the second transistor T2 is connected with the first clock signal line CK1, a first electrode of the second transistor T2 is connected with the first power supply line VGL, and a second electrode of the second transistor T2 is connected with the second denoising control node PD2. A first electrode of the first capacitor C1 is connected with the second denoising control node PD2, and a second electrode of the first capacitor C1 is connected with the second clock signal line CB1. A first electrode of the second capacitor C2 is connected with the first denoising control node PD1, and a second electrode of the second capacitor C2 is connected with the first power supply line VGL. A control electrode of the third transistor T3 is connected with the first output terminal Gp, a first electrode of the third transistor T3 is connected with the second power supply line VGH, and a second electrode of the third transistor T3 is connected with the second denoising control node PD2. A control electrode of the fourth transistor T4 is connected with the first output terminal Gp, a first electrode of the fourth transistor T4 is connected with the second power supply line VGH, and a second electrode of the fourth transistor T4 is connected with the first denoising control node PD1. In this exemplary embodiment, a charge pump structure is formed by the first transistor T1, the second transistor T2, the first capacitor C1, and the second capacitor C2, and a potential of the first denoising control node PD1 is stabilized at a potential at which the denoising subunit of the output unit 202 is turned on by using a voltage regulation function of the charge pump structure, so as to ensure that the denoising subunit is continuously turned on in a holding phase of a drive process of a row of gate lines, thereby continuously denoising the second output terminal Gout.

In some exemplary embodiments, as shown in FIG. 1, the output unit 202 includes an output subunit and a denoising subunit. The denoising subunit includes a fifth transistor T5, and the output subunit includes a sixth transistor T6. A control electrode of the fifth transistor T5 is connected with the first denoising control node PD1, a first electrode of the fifth transistor T5 is connected with the first power supply line VGL, and a second electrode of the fifth transistor T5 is connected with the second output terminal Gout. A control electrode of the sixth transistor T6 is connected with a third node N3 of the input sub-circuit 100, a first electrode of the sixth transistor T6 is connected with the fifth clock signal line CB3, and a second electrode of the sixth transistor is connected with the second output terminal Gout.

In some exemplary embodiments, as shown in FIG. 1, the input sub-circuit 100 includes a seventh transistor T7, an eighth transistor T8, a ninth transistor T9, a tenth transistor T10, an eleventh transistor T11, a twelfth transistor T12, a thirteenth transistor T13, a fourteenth transistor T14, a third capacitor C3, and a fourth capacitor C4. A control electrode of the seventh transistor T7 is connected with the third clock signal line CK2, a first electrode of the seventh transistor T7 is connected with the input terminal INPUT, and a second electrode of the seventh transistor T7 is connected with a first node N1. A control electrode of the eighth transistor T8 is connected with the first node N1, a first electrode of the eighth transistor T8 is connected with the third clock signal line CK2, and a second electrode of the eighth transistor T8 is connected with a second node N2. A control electrode of the ninth transistor T9 is connected with the third clock signal line CK2, a first electrode of the ninth transistor T9 is connected with the first power supply line VGL, and a second electrode of the ninth transistor T9 is connected with the second node N2. A control electrode of the tenth transistor T10 is connected with the second node N2, a first electrode of the tenth transistor T10 is connected with the second power supply line VGH, and a second electrode of the tenth transistor T10 is connected with the first output terminal Gp. A control electrode of the eleventh transistor T11 is connected with a third node N3, a first electrode of the eleventh transistor T11 is connected with the fourth clock signal line CB2, and a second electrode of the eleventh transistor T11 is connected with the first output terminal Gp. A control electrode of the twelfth transistor T12 is connected with the second node N2, a first electrode of the twelfth transistor T12 is connected with the second power supply line VGH, and a second electrode of the twelfth transistor T12 is connected with a fourth node N4. A control electrode of the thirteenth transistor T13 is connected with the fourth clock signal line CB2, a first electrode of the thirteenth transistor T13 is connected with the fourth node N4, and a second electrode of the thirteenth transistor T13 is connected with the first node N1. A control electrode of the fourteenth transistor T14 is connected with the first power supply line VGL, a first electrode of the fourteenth transistor T14 is connected with the first node N1, and a second electrode of the fourteenth transistor T14 is connected with the third node N3. A first electrode of the third capacitor C3 is connected with the second node N2, and a second electrode of the third capacitor C3 is connected with the second power supply line VGH. A first electrode of the fourth capacitor C4 is connected with the third node N3, and a second electrode of the fourth capacitor C4 is connected with the first output terminal Gp.

In this exemplary embodiment, the first denoising control node PD1, the second denoising control node PD2, the first output terminal Gp, the first node N1, the second node N2, the third node N3, and the fourth node N4 do not represent actual components, but represent convergence points of related electrical connections in a circuit diagram. In other words, these nodes are nodes equivalent to the convergence points of related electrical connections in the circuit diagram.

In this exemplary embodiment, an exemplary structure of an input sub-circuit, an output unit, and a denoising control unit is shown in FIG. 1. Those skilled in the art should easily understand that an embodiment of the input sub-circuit, the output unit, and the denoising control unit is not limited to this as long as their functions can be achieved.

Figure 2:
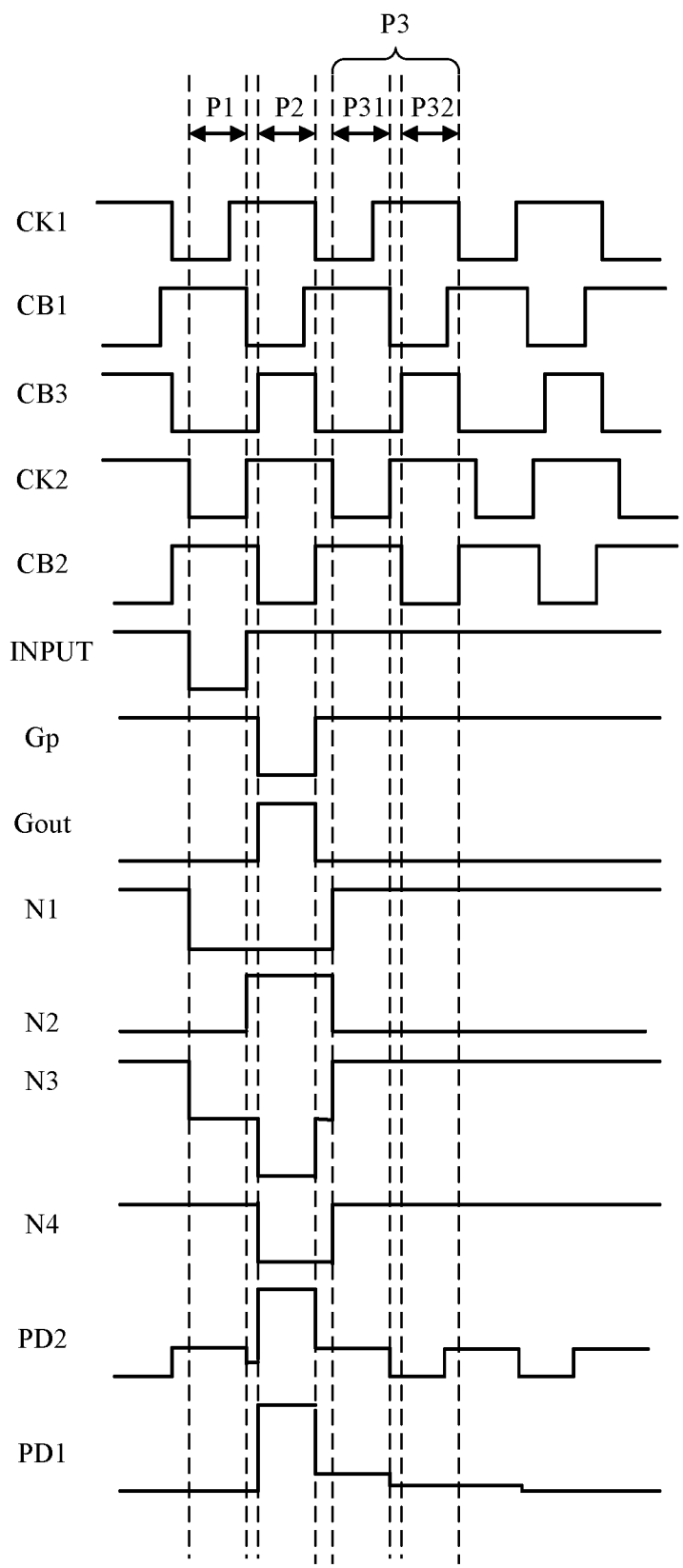
FIG. 2 is a working timing diagram of the shift register unit shown in FIG. 1.

Technical solutions of the embodiments of the present disclosure will be further described below through a working process of a shift register unit. The following description is made taking a working process of a first stage shift register unit as an example. An input terminal INPUT of the first stage shift register unit is connected with an initial signal line STV. FIG. 2 is a working timing diagram of the shift register unit shown in FIG. 1. As shown in FIG. 1 and FIG. 2, a drive process of a row of gate lines includes: an input phase P1, an output phase P2, and a holding phase P3. In the input phase P1, the input sub-circuit 100 writes a signal of the input terminal INPUT under control of the third clock signal line CK1. In the output phase P2, under control of the first power supply line VGL, the input sub-circuit 100 transmits a turn-on signal to the output unit 202 according to the written signal. Under control of the turn-on signal, the output unit 202 transmits a signal of the fifth clock signal line CB3 to the second output terminal Gout to scan a gate line connected with the second output terminal Gout. In the holding phase P3, under control of the first clock signal line CK1, the denoising control unit 201 transmits a voltage of the first power supply line VGL to the first denoising control node PD1, so that a voltage of the first denoising control node PD1 is kept at a voltage at which the denoising subunit of the output unit 202 can be turned on, and the denoising subunit is continuously turned on under control of the first denoising control node PD1 to denoise the second output terminal Gout.

In this exemplary embodiment, in a drive process of a row of gate lines within one frame period, after the shift register unit outputs a scanning signal through the second output terminal, the shift register unit outputs a non-operating voltage to a gate line with which the shift register unit is connected in the holding stage to ensure that a sub-pixel connected with the gate line is turned off.

A case that transistors in the shift register units are all P-type transistors, a voltage transmitted by the first power supply line VGL is a low-level voltage, and a voltage provided by the second power supply line VGH is a high-level voltage is taken as an example for following description.

The drive process of the shift register unit provided in this exemplary embodiment with a row of gate lines at least includes following phases.

In the input phase P1, the input terminal INPUT provides a low-level signal, the first clock signal line CK1 provides a low-level signal, the second clock signal line CB1 provides a high-level signal, the third clock signal line CK2 provides a low-level signal, the fourth clock signal line CB2 provides a high-level signal, and the fifth clock signal line CB3 provides a low-level signal.

In this phase, the seventh transistor T7 is turned on under control of the low-level signal of the third clock signal line CK2, and the input terminal INPUT provides the low-level signal to the first node N1; the eighth transistor T8 is turned on under control of a low-level voltage of the first node N1; the ninth transistor T9 is turned on under control of the low-level signal of the third clock signal line CK2, and a voltage of the second node N2 is a low-level voltage.

The tenth transistor T10 is turned on under control of the low-level voltage of the second node N2, and a high-level voltage of the second power supply line VGH is transmitted to the first output terminal Gp through the tenth transistor T10. The fourteenth transistor T14 is turned on under control of the first power supply line VGL, and transmits the low-level voltage of the first node N1 to the third node N3 and the eleventh transistor T11. The eleventh transistor T11 is turned on, and the eleventh transistor T11 transmits the high-level signal of the fourth clock signal line CB2 to the first output terminal Gp, and a voltage of the first output terminal Gp is a high-level voltage.

The fourth capacitor C4 is charged. A voltage of the first electrode of the fourth capacitor C4 connected with the third node N3 is a low-level voltage, and a voltage of the second electrode connected with the eleventh transistor T11 is a high-level voltage, so that writing of a signal transmitted by the input terminal INPUT may be achieved.

The third transistor T3 and the fourth transistor T4 are both turned off under control of the high-level voltage of the first output terminal Gp. The second transistor T2 is turned on under control of the low-level signal output by the first clock signal line CK1, a voltage of the second denoising control node PD2 is a low-level voltage, the first transistor T1 is turned on under control of the low-level voltage of the second denoising control node PD2, a voltage of the first denoising control node PD1 is a low-level voltage, the fifth transistor T5 is turned on, and a voltage of the second output terminal Gout is a low-level voltage, thus achieving denoising the second output terminal Gout.

The twelfth transistor T12 is turned on under control of the low-level voltage of the second node N2, the twelfth transistor T12 transmits the high-level voltage of the second power supply line VGH connected with the first electrode of the twelfth transistor T12 to the fourth node N4, and the thirteenth transistor T13 is turned off under control of the high-level signal of the fourth clock signal line CB2, so that a voltage of the fourth node N4 is a high-level voltage.

The sixth transistor T6 is turned on under control of the low-level voltage of the third node N3, and the low-level voltage output by the fifth clock signal line CB3 is transmitted to the second output terminal Gout through the sixth transistor T6, so that the second output terminal Gout outputs a low-level voltage and does not output a scanning signal.

In the output phase P2, the input terminal INPUT provides a high-level signal, the first clock signal line CK1 provides a high-level signal, the second clock signal line CB1 provides a low-level signal, the third clock signal line CK2 provides a high-level signal, the fourth clock signal line CB2 provides a low-level signal, and the fifth clock signal line CB3 provides a high-level signal.

In this phase, the seventh transistor T7 is turned off under control of the high-level signal of the third clock signal line CK2, and the voltage of the first node N1 is still a low-level voltage. The eighth transistor T8 is turned on under control of the low-level voltage of the first node N1, and the high-level signal of the third clock signal line CK2 is transmitted to the second node N2 through the eighth transistor T8; the ninth transistor T9 is turned off under control of the high-level signal of the third clock signal line CK2, and the voltage of the second node N2 is a high-level voltage.

The tenth transistor T10 is turned off under control of the high-level voltage of the second node N2. The fourteenth transistor T14 is turned on under control of the first power supply line VGL, and transmits the low-level voltage of the first node N1 to the third node N3 and the eleventh transistor T11. The eleventh transistor T11 is turned on, and the eleventh transistor T11 transmits the low-level signal of the fourth clock signal line CB2 to the first output terminal Gp, and the voltage of the first output terminal Gp is a low-level voltage.

The voltage of the second electrode of the fourth capacitor C4 connected with the eleventh transistor T11 is a low-level voltage, and the voltage of the second electrode of the fourth capacitor C4 connected with the eleventh transistor T11 drops from the high-level voltage of the input phase P1 to a low-level voltage. Due to a capacitance bootstrap effect of the fourth capacitor C4, a voltage of the third node N3 connected with the first electrode of the fourth capacitor C4 is further pulled down.

The sixth transistor T6 is turned on under control of the low-level voltage of the third node N3, and the high-level voltage output by the fifth clock signal line CB3 is transmitted to the second output terminal Gout through the sixth transistor T6, so that the second output terminal Gout outputs a scanning signal to achieve scanning for a gate line.

The third transistor T3 and the fourth transistor T4 are both turned on under control of the low-level voltage of the first output terminal Gp, and a signal of the second power supply line VGH is transmitted to the second denoising control node PD2 through the third transistor T3, and then transmitted to the first denoising control node PD1 through the fourth transistor T4. Voltages of the second denoising control node PD2 and the first denoising control node PD1 are both high-level voltages, and the fifth transistor T5 is turned off, which does not affect the second output terminal Gout to output a scanning signal. The second transistor T2 is turned off under control of the high-level signal output by the first clock signal line CK1, and the first transistor T1 is turned off under control of the high-level voltage of the second denoising control node PD2.

The twelfth transistor T12 is turned off under control of the high-level voltage of the second node N2, the thirteenth transistor T13 is turned on under control of the low-level signal of the fourth clock signal line CB2, and a voltage of the fourth node N4 is equal to a voltage of the first node N1, that is, a low-level voltage.

In a first holding phase P31 of the holding phase P3, the input terminal INPUT inputs a high-level signal, the first clock signal line CK1 provides a low-level signal, the second clock signal line CB1 provides a high-level signal, the third clock signal line CK2 provides a low-level signal, the fourth clock signal line CB2 provides a high-level signal, and the fifth clock signal line CB3 provides a low-level signal.

In this phase, the seventh transistor T7 is turned on under control of the low-level signal of the third clock signal line CK2, and the high-level signal of the input terminal INPUT is transmitted to the first node N1 through the seventh transistor T7, so that the voltage of the first node N1 becomes a high-level voltage; the eighth transistor T8 is turned off under control of the high-level voltage of the first node N1; the ninth transistor T9 is turned on under control of the low-level signal of the third clock signal line CK2, and the low-level signal of the first power supply line VGL is transmitted to the second node N2 through the ninth transistor T9, so that a voltage of the second node N2 is a low-level voltage.

The tenth transistor T10 is turned on under control of the low-level voltage of the second node N2, and the high-level voltage of the second power supply line VGH is transmitted to the first output terminal Gp through the tenth transistor T10; the fourteenth transistor T14 is turned on under control of the first power supply line VGL, and transmits the high-level voltage of the first node N1 to the third node N3 and the eleventh transistor T11. The eleventh transistor T11 is turned off, and a voltage of the first output terminal Gp is a high-level voltage.

The third transistor T3 and the fourth transistor T4 are both turned off under control of the high-level voltage of the first output terminal Gp. The second transistor T2 is turned on under control of the low-level signal output by the first clock signal line CK1, a voltage of the second denoising control node PD2 is a low-level voltage. A voltage of the first electrode of the first capacitor C1 connected with the second denoising control node PD2 is a low-level voltage, and a voltage of the second electrode of the first capacitor C1 connected with the second clock signal line CB1 is a voltage of the high-level signal of the second clock signal line CB2. The first transistor T1 is turned on under control of the low-level voltage of the second denoising control node PD2, a voltage of the first denoising control node PD1 is a low-level voltage, the fifth transistor T5 is turned on, and a voltage of the second output terminal Gout is a low-level voltage, thus achieving denoising for the second output terminal Gout.

The twelfth transistor T12 is turned on under control of the low-level voltage of the second node N2, the twelfth transistor T12 transmits the high-level voltage of the second power supply line VGH connected with the first electrode of the twelfth transistor T12 to the fourth node N4, the thirteenth transistor T13 is turned off under control of the high-level signal of the fourth clock signal line CB2, and a voltage of the fourth node N4 is a high-level voltage.

The sixth transistor T6 is turned off under control of the high-level voltage of the third node N3.

In a second holding phase P32 of the holding phase P3, the input terminal INPUT inputs a high-level signal, the first clock signal line CK1 provides a high-level signal, the second clock signal line CB1 provides a low-level signal, the third clock signal line CK2 provides a high-level signal, the fourth clock signal line CB2 provides a low-level signal, and the fifth clock signal line CB3 provides a high-level signal.

The seventh transistor T7 is turned off under control of the high-level signal of the third clock signal line CK2, and the voltage of the first node N1 is still a high-level voltage; the eighth transistor T8 is still turned off under control of the high-level voltage of the first node N1; the ninth transistor T9 is turned off under control of the high-level signal of the third clock signal line CK2, and the voltage of the second node N2 is still a low-level voltage.

The tenth transistor T10 is turned on under control of the low-level voltage of the second node N2, and the high-level voltage of the second power supply line VGH is transmitted to the first output terminal Gp through the tenth transistor T10; the fourteenth transistor T14 is turned on under control of the first power supply line VGL, and transmits the high-level voltage of the first node N1 to the third node N3 and the eleventh transistor T11. The eleventh transistor T11 is turned off, and a voltage of the first output terminal Gp is a high-level voltage.

The third transistor T3 and the fourth transistor T4 are both turned off under control of the high-level voltage of the first output terminal Gp. The second transistor T2 is turned off under control of the high-level signal output by the first clock signal line CK1, and the second denoising control node PD2 is in a floating state. The voltage of the second electrode of the first capacitor C1 connected with the second clock signal line CB1 drops from the high-level voltage of the first holding phase P31 to the low-level voltage provided by the second clock signal line CB1. Due to a coupling effect of the first capacitor C1, the voltage of the second denoising control node PD2 is shifted. Since the voltage of the first denoising control node PD1 is a low-level voltage, the first transistor T1 is turned on, and about half of charge flows from the first denoising control node PD1 to the second denoising control node PD2. That is, the first denoising control node PD1 and the second denoising control node PD2 divide the voltage equally.

After that, because signals of the first clock signal line CK1 and the second clock signal line CB1 are alternately a high-level signal and a low-level signal, that is, in the holding phase P3, the first holding phase P31 and the second holding phase P32 are alternately performed, the first denoising control node PD1 and the second denoising control node PD2 are coupled for many times, and voltages are averaged for many times, so that a voltage of the first denoising control node PD1 is stabilized around a certain voltage, and the fifth transistor T5 is continuously turned on in the holding phase P3 to continuously denoise the second output terminal Gout.

In the second holding phase P32, the twelfth transistor T12 is turned on under control of the low-level voltage of the second node N2, the twelfth transistor T12 transmits the high-level voltage of the second power supply line VGH connected with the first electrode of the twelfth transistor T12 to the fourth node N4, the thirteenth transistor T13 is turned on under control of the low-level signal of the fourth clock signal line CB2, and a voltage of the fourth node N4 is a high-level voltage. The second power supply line VGH is jointly controlled by the thirteenth transistor T13 and the twelfth transistor T12 to charge the first node N1, to keep the first node N1 at a high-level voltage, and to ensure that the eleventh transistor T11 is in an off state.

The sixth transistor T6 is turned off under control of the high-level voltage of the third node N3.

According to this exemplary embodiment, by continuously denoising the second output terminal Gout in the holding phase, stability of a display picture may be kept and a display effect may be improved.

Figure 3:
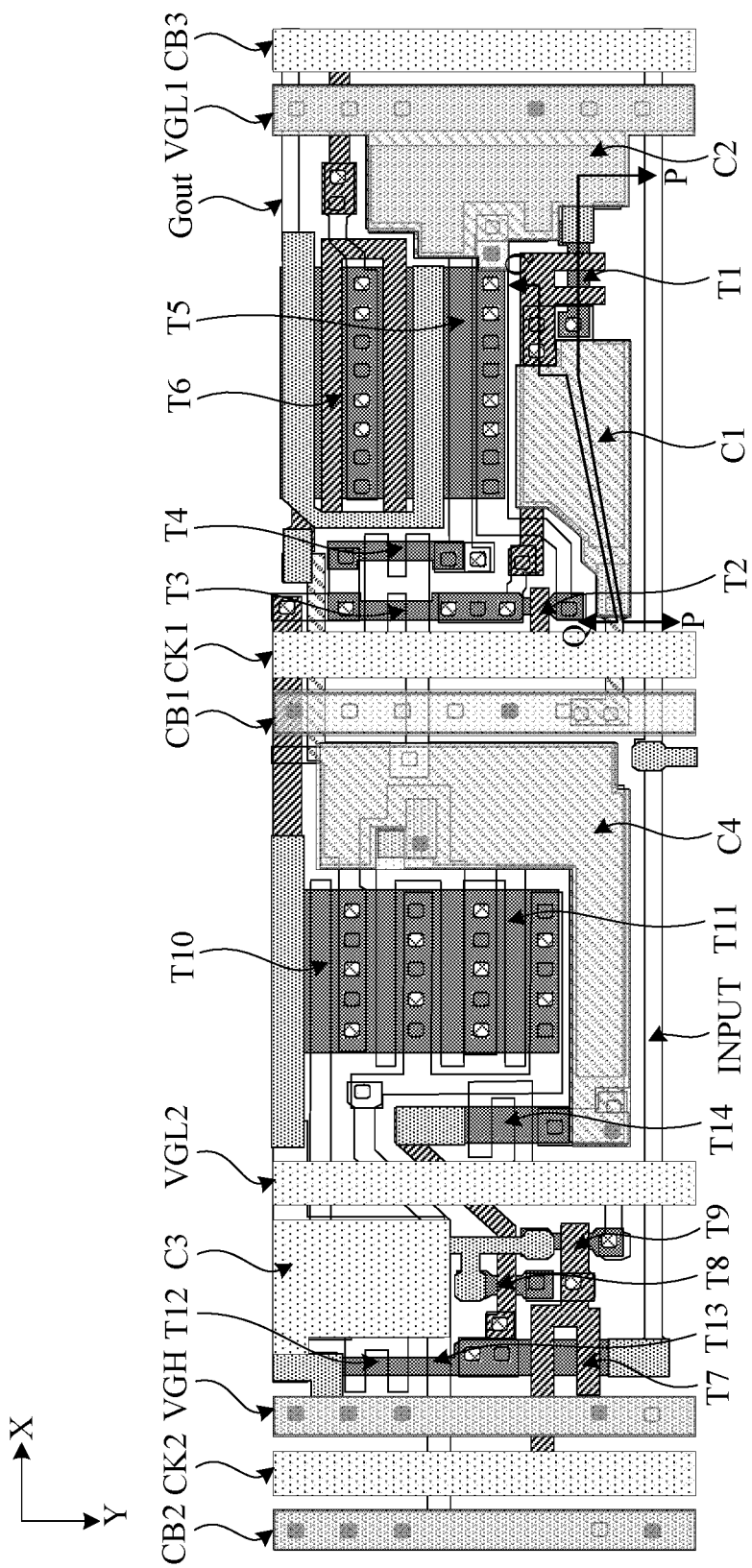
FIG. 3 is a top view of a shift register unit according to at least one embodiment of the present disclosure.
Figure 4:
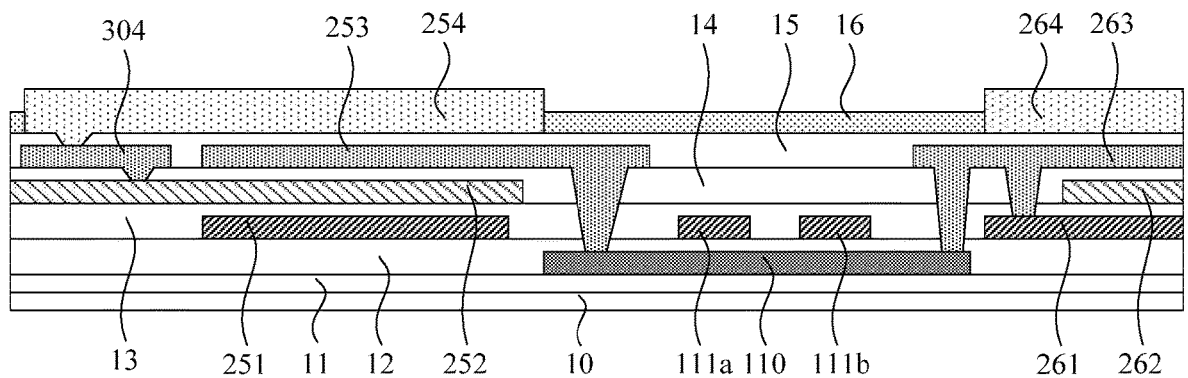
FIG. 4 is a schematic sectional view along a P-P direction in FIG. 3.
Figure 5:
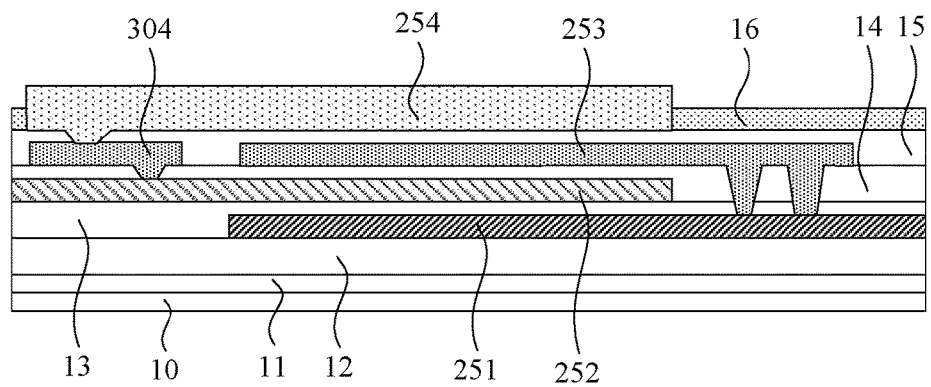
FIG. 5 is a schematic sectional view along a Q-Q direction in FIG. 3.

FIG. 3 is a top view of a shift register unit according to at least one embodiment of the present disclosure. FIG. 4 is a schematic sectional view along a P-P direction in FIG. 3. FIG. 5 is a schematic sectional view along a Q-Q direction in FIG. 3. An equivalent circuit diagram of the shift register unit of this exemplary embodiment is shown in FIG. 1. In this exemplary embodiment, a case that a transistor in the shift register unit is a P-type transistor and is also a low-temperature polysilicon thin film transistor is taken as an example for description. However, this embodiment is not limited to this.

In some exemplary embodiments, as shown in FIG. 3, in a direction parallel to a display substrate, a third group of clock signal lines, an input sub-circuit, a first group of clock signal lines, a denoising output sub-circuit, and a second group of clock signal lines are sequentially arranged along a first direction X. The first group of clock signal lines includes a first clock signal line CK1 and a second clock signal line CB1, the second group of clock signal lines includes a fifth clock signal line CB3, and the third group of clock signal lines includes a third clock signal line CK2 and a fourth clock signal line CB2. The first clock signal line CK1 and the second clock signal line CB1 are located between the input sub-circuit and the denoising output sub-circuit, which may minimize load on the first clock signal line CK1 and the second clock signal line CB1, which is beneficial to reduce durations of a rising edge and a falling edge of the shift register unit, thereby improving performance of the shift register unit.

In some exemplary embodiments, as shown in FIG. 3, low-level signals are provided through two first power supply lines VGL1 and VGL2, wherein the first power supply line VGL1 (corresponding to the first first power supply line mentioned above) is configured to provide a low-level signal to the denoising output sub-circuit, and the first power supply line VGL2 (corresponding to the second first power supply line mentioned above) is configured to provide a low-level signal to the input sub-circuit. The first power supply line VGL1 and the fifth clock signal line CB3 are located on a side of the denoising output sub-circuit away from the input sub-circuit. The first power supply line VGL2 is located between a third capacitor C3 and a fourth capacitor C4 of the input sub-circuit. For example, the fifth clock signal line CB3 may be located on a side of the first power supply line VGL1 away from the denoising output sub-circuit. However, this embodiment is not limited to this.

In some exemplary embodiments, as shown in FIG. 3, the third clock signal line CK2, the fourth clock signal line CB2, and the second power supply line VGH are located on a side of the input sub-circuit away from the denoising output sub-circuit. For example, the third clock signal line CK2 is located on a side of the second power supply line VGH away from the input sub-circuit, and the fourth clock signal line CB2 is located on a side of the third clock signal line CK2 away from the second power supply line VGH. However, this embodiment is not limited to this. For example, the third clock signal line CK2 may be located on a side of the fourth clock signal line CB2 away from the second power supply line VGH.

In some exemplary embodiments, as shown in FIG. 3, the first clock signal line CK1, the second clock signal line CB1, the third clock signal line CK2, the fourth clock signal line CB2, the fifth clock signal line CB3, the second power supply line VGH, the first power supply lines VGL1 and VGL2 all extend along a second direction Y. An input terminal INPUT and a second output terminal Gout extend along the first direction X. The first direction X and the second direction Y intersect, for example, they are perpendicular to each other.

In some exemplary embodiments, as shown in FIG. 3, in a direction parallel to a display substrate, both the first capacitor C1 and the second capacitor C2 are adjacent to a first transistor T1. The first capacitor C1 and the second capacitor C2 are located on opposite sides of the first transistor T1, for example, on opposite sides of the first transistor T1 in the first direction X. However, this embodiment is not limited to this. For example, the first capacitor C1 and the second capacitor C2 may be located on a same side of the first transistor T1. In some examples, a second transistor T2 is located on a side of the first capacitor C1 away from the first transistor T1. In this exemplary embodiment, by setting the first capacitor C1 and the second capacitor C2 to be adjacent to the first transistor T1, a layout density of the shift register unit may be improved, which is beneficial for achieving a narrow bezel.

In some exemplary embodiments, as shown in FIG. 3, in a direction parallel to the display substrate, the third transistor T3 and the fourth transistor T4 are located on a side of the second transistor T2 away from the first capacitor C1. The third transistor T3 and the fourth transistor T4 are adjacent to the second transistor T2 in the second direction Y. The third transistor T3 is located on a side of the fourth transistor T4 close to the first clock signal line CK1. The fifth transistor T5 and the sixth transistor T6 are located between the fourth transistor T4 and the second capacitor C2.

In some exemplary embodiments, as shown in FIG. 3, the third capacitor C3 is located between the twelfth transistor T12 and the first power supply line VGL2 in a direction parallel to the display substrate. The tenth transistor T10, the eleventh transistor T11, and the fourteenth transistor T14 are located between the first power supply line VGL2 and the fourth capacitor C4. The seventh transistor T7, the eighth transistor T8, and the ninth transistor T9 are located between the second power supply line VGH and the first power supply line VGL2. The twelfth transistor T12 and the thirteenth transistor T13 are located between the second power supply line VGH and the third capacitor C3. However, this embodiment is not limited to this.

In some exemplary embodiments, as shown in FIG. 3 to FIG. 5, in a direction perpendicular to the display substrate, a non-display region of the display substrate may include: a base substrate 10, and a semiconductor layer, a first conductive layer, a second conductive layer, a third conductive layer, and a fourth conductive layer which are sequentially arranged on the base substrate 10. A first insulating layer 11 is arranged between the base substrate 10 and the semiconductor layer. A second insulating layer 12 is arranged between the first conductive layer and the semiconductor layer. A third insulating layer 13 is arranged between the first conductive layer and the second conductive layer. A fourth insulating layer 14 is arranged between the second conductive layer and the third conductive layer. A fifth insulating layer 15 and a sixth insulating layer 16 are arranged between the third conductive layer and the fourth conductive layer. The fifth insulating layer 15 is located on a side of the sixth insulating layer 16 close to the base substrate 10. In some examples, the first insulating layer 11 to the fifth insulating layer 15 are inorganic insulating layers, and the sixth insulating layer 16 is an organic insulating layer. However, this embodiment is not limited to this.

Figure 6A:
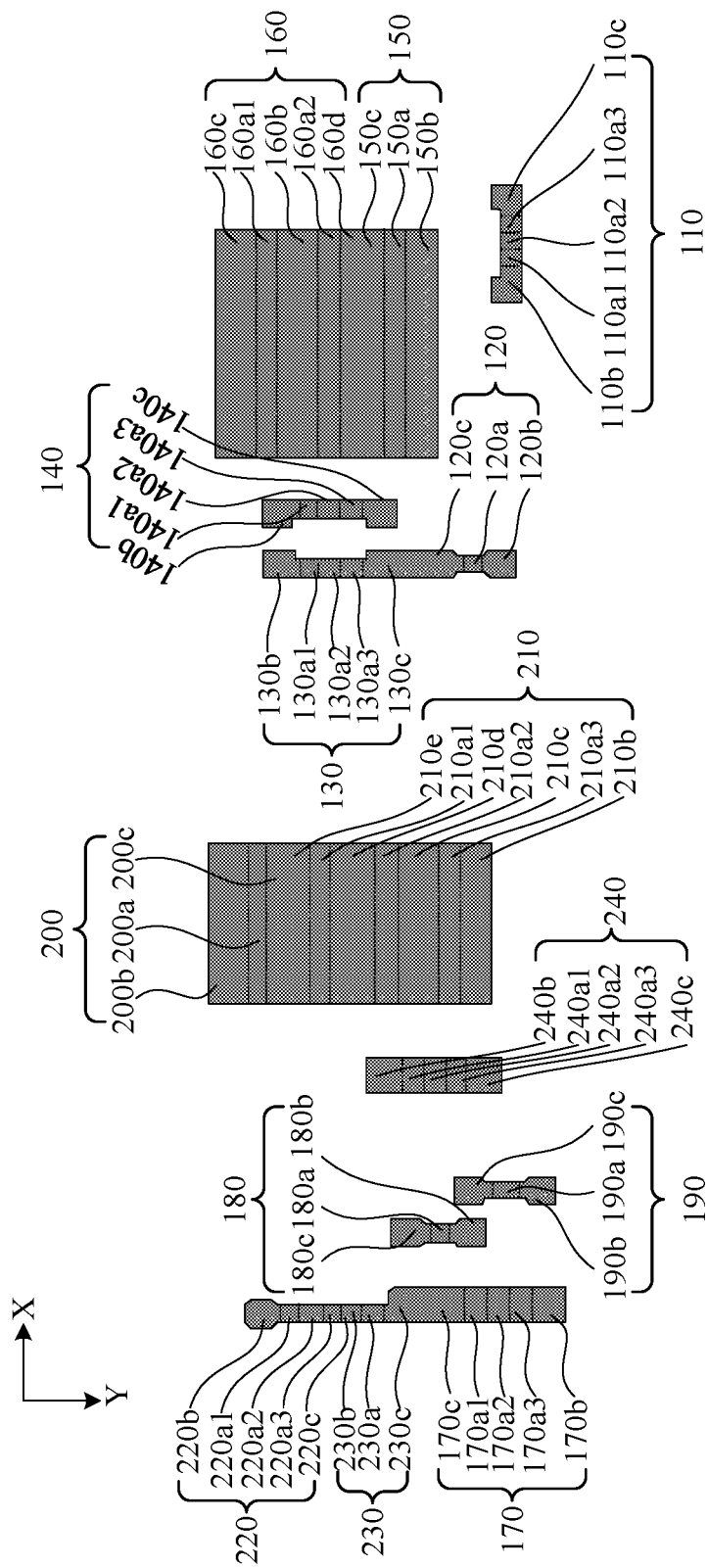
FIG. 6A is a top view of a shift register unit after a semiconductor layer is formed according to at least one embodiment of the present disclosure.

FIG. 6A is a top view of a shift register unit after a semiconductor layer is formed according to at least one embodiment of the present disclosure. As shown in FIGS. 3 to 6A, a semiconductor layer in the non-display region at least includes: an active layer 110 of the first transistor T1, an active layer 120 of the second transistor T2, an active layer 130 of the third transistor T3, an active layer 140 of the fourth transistor T4, an active layer 150 of the fifth transistor T5, an active layer 160 of the sixth transistor T6, an active layer 170 of the seventh transistor T7, an active layer 180 of the eighth transistor T8, an active layer 190 of the ninth transistor T9, an active layer 200 of the tenth transistor T10, an active layer 210 of the eleventh transistor T11, an active layer 220 of the twelfth transistor T12, an active layer 230 of the thirteenth transistor T13, and an active layer 240 of the fourteenth transistor T14.

In some exemplary embodiments, in the first direction X, the active layer 140 of the fourth transistor T4 is located between the active layer 130 of the third transistor T3 and the active layer 160 of the sixth transistor T6; the active layer 180 of the eighth transistor T8 is located between the active layer 170 of the seventh transistor T7 and the active layer 190 of the ninth transistor T9, the active layer 240 of the fourteenth transistor T14 is located between the active layer 190 of the ninth transistor T9 and the active layer 210 of the eleventh transistor T11. In the second direction Y, the active layer 110 of the first transistor T1 is located on a side of the active layer 150 of the fifth transistor T5.

In some exemplary embodiments, the active layer 110 of the first transistor T1 extends along the first direction X, and the active layer 120 of the second transistor T2 to the active layer 240 of the fourteenth transistor T14 all extend along the second direction Y. However, this embodiment is not limited to this.

In some exemplary embodiments, the active layer 120 of the second transistor T2 and the active layer 130 of the third transistor T3 may be of an integrated structure. The active layer 150 of the fifth transistor T5 and the active layer 160 of the sixth transistor T6 may be of an integrated structure, for example, may have a shape of rectangular. The active layer 170 of the seventh transistor T7, the active layer 220 of the twelfth transistor T12, and the active layer 230 of the thirteenth transistor T13 may be of an integrated structure. The active layer 200 of the tenth transistor T10 and the active layer 210 of the eleventh transistor T11 may be of an integrated structure, for example, may have a shape of rectangular. However, this embodiment is not limited to this.

In some exemplary embodiments, a material of the semiconductor layer may include, for example, polysilicon. An active layer may include at least one channel region and a plurality of doped regions. The channel region may not be doped with impurities, and has characteristics of a semiconductor. The plurality of doped regions may be on two sides of the channel region and doped with impurities, and thus have conductivity. An impurity may change according to a type of the transistor.

In some exemplary embodiments, a doped region of an active layer may be interpreted as a source electrode or drain electrode of a transistor. For example, a source electrode of the second transistor T2 may correspond to a first doped region 120b doped with an impurity at a periphery of a channel region 120a of the active layer 120, and a drain electrode of the second transistor T2 may correspond to a second doped region 120c doped with an impurity at the periphery of the channel region 120a of the active layer 120. In addition, a part of an active layer between transistors may be interpreted as a wiring doped with an impurity, and may be used for electrically connecting the transistors.

Figure 6B:
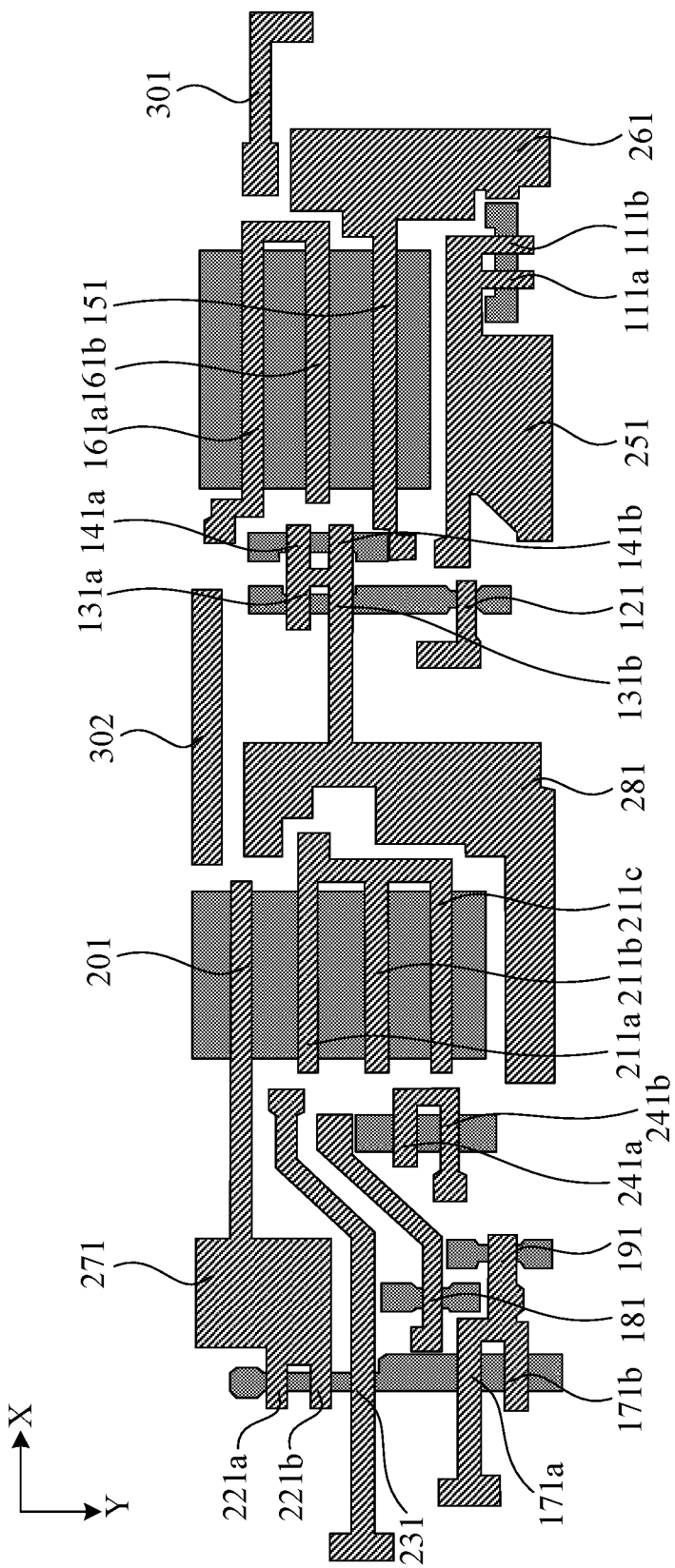
FIG. 6B is a top view of a shift register unit after a first conductive layer is formed according to at least one embodiment of the present disclosure.

FIG. 6B is a top view of a shift register unit after a first conductive layer is formed according to at least one embodiment of the present disclosure. As shown in FIGS. 3 to 6B, the first conductive layer may include: control electrodes 111a and 111b of the first transistor T1, a control electrode 121 of the second transistor T2, control electrodes 131a and 131b of the third transistor T3, control electrodes 141a and 141b of the fourth transistor T4, a control electrode 151 of the fifth transistor T5, control electrodes 161a and 161b of the sixth transistor T6, control electrodes 171a and 171b of the seventh transistor T7, a control electrode 181 of the eighth transistor T8, a control electrode 191 of the ninth transistor T9, a control electrode 201 of the tenth transistor T10, control electrodes 211a, 211b, and 211c of the eleventh transistor T11, control electrodes 221a and 221b of the twelfth transistor T12, a control electrode 231 of the thirteenth transistor T13, control electrodes 241a and 241b of the fourteenth transistor T14, a first sub-electrode 251 of the first capacitor C1, a first sub-electrode 261 of the second capacitor C2, a first sub-electrode 271 of the third capacitor C3, a first sub-electrode 281 of the fourth capacitor C4, a first connection electrode 301, and a second connection electrode 302.

In some exemplary embodiments, the control electrodes 111a and 111b of the first transistor T1 and the first sub-electrode 251 of the first capacitor C1 may be of an integrated structure. The first sub-electrode 261 of the second capacitor C2 and the control electrode 251 of the fifth transistor T5 may be of an integrated structure. The control electrodes 161a and 161b of the sixth transistor T6 may be of an integrated structure. The control electrodes 131a and 131b of the third transistor T3, the control electrodes 141a and 141b of the fourth transistor T4, and the first sub-electrode 281 of the fourth capacitor C4 may be of an integrated structure. The control electrodes 171a and 171b of the seventh transistor T7 and the control electrode 191 of the ninth transistor T9 may be of an integrated structure. The control electrodes 221a and 221b of the twelfth transistor T12, the first sub-electrode 271 of the third capacitor C3, and the control electrode 201 of the tenth transistor T10 may be of an integrated structure. The control electrodes 211a, 211b, and 221c of the eleventh transistor T11 form an integrated structure. The control electrodes 241a and 241b of the fourteenth transistor T14 may be of an integrated structure.

In this exemplary embodiment, the first transistor T1, the third transistor T3, the fourth transistor T4, the sixth transistor T6, the seventh transistor T7, the twelfth transistor T12, and the fourteenth transistor T14 may be double-gate transistors, and the eleventh transistor T11 may be a triple-gate transistor, so as to prevent and reduce leakage current. However, this embodiment is not limited to this.

Figure 6C:
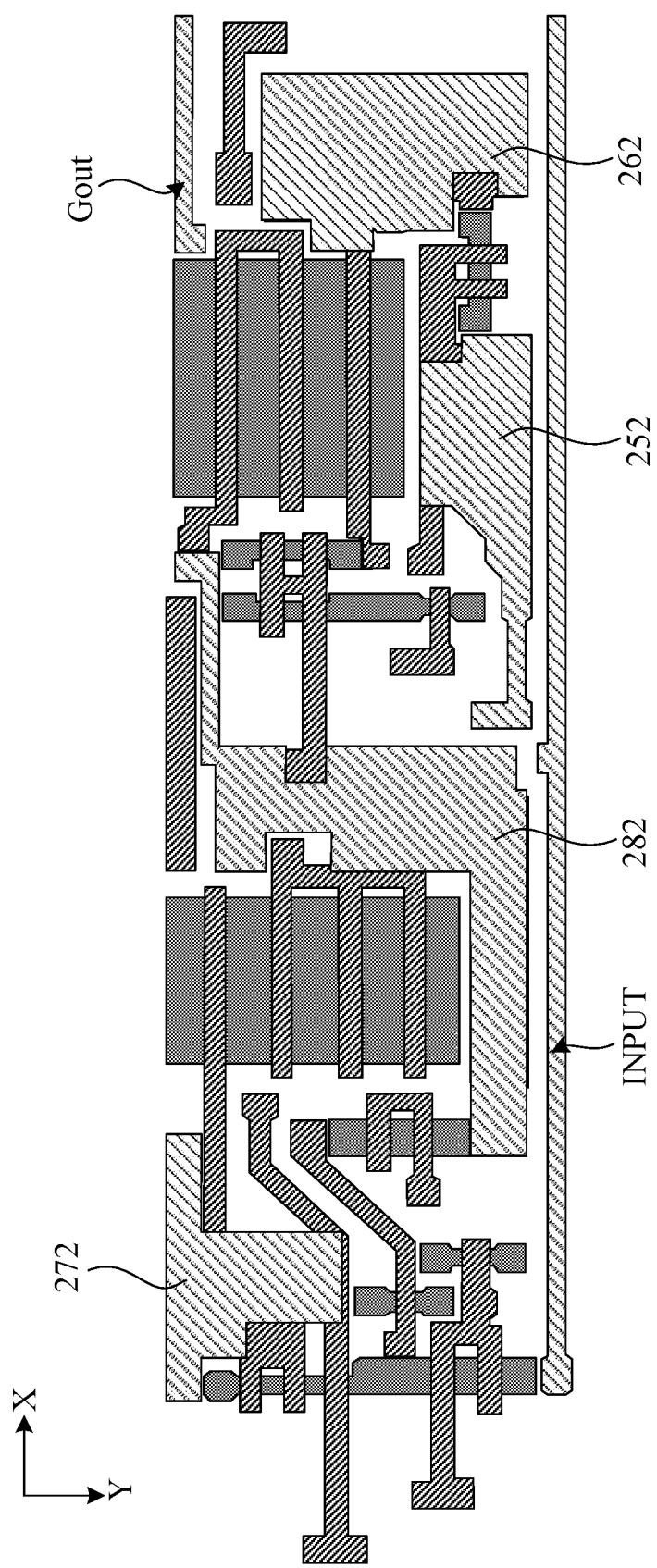
FIG. 6C is a top view of a shift register unit after a second conductive layer is formed according to at least one embodiment of the present disclosure.

FIG. 6C is a top view of a shift register unit after a second conductive layer is formed according to at least one embodiment of the present disclosure. As shown in FIGS. 3 to 6C, the second conductive layer may include an input terminal INPUT, a second output terminal Gout, a second sub-electrode 252 of the first capacitor C1, a second sub-electrode 262 of the second capacitor C2, a second sub-electrode 272 of the third capacitor C3, and a second sub-electrode 282 of the fourth capacitor C4. The second sub-electrode 252 of the first capacitor C1 is overlapped with the first sub-electrode 251. The second sub-electrode 262 of the second capacitor C2 is overlapped with the first sub-electrode 261. The second sub-electrode 272 of the third capacitor C3 is overlapped with the first sub-electrode 271. The second sub-electrode 282 of the fourth capacitor C4 is overlapped with the first sub-electrode 281.

In some exemplary embodiments, the input terminal INPUT is located on a same side of the fourth capacitor C4, the second capacitor C2, and the first capacitor C1, and the input terminal INPUT extends along the first direction X. The second output terminal Gout is located on a side of the second capacitor C2 away from the input terminal INPUT, and the second output terminal Gout extends along the first direction X. However, this embodiment is not limited to this.

Figure 6D:
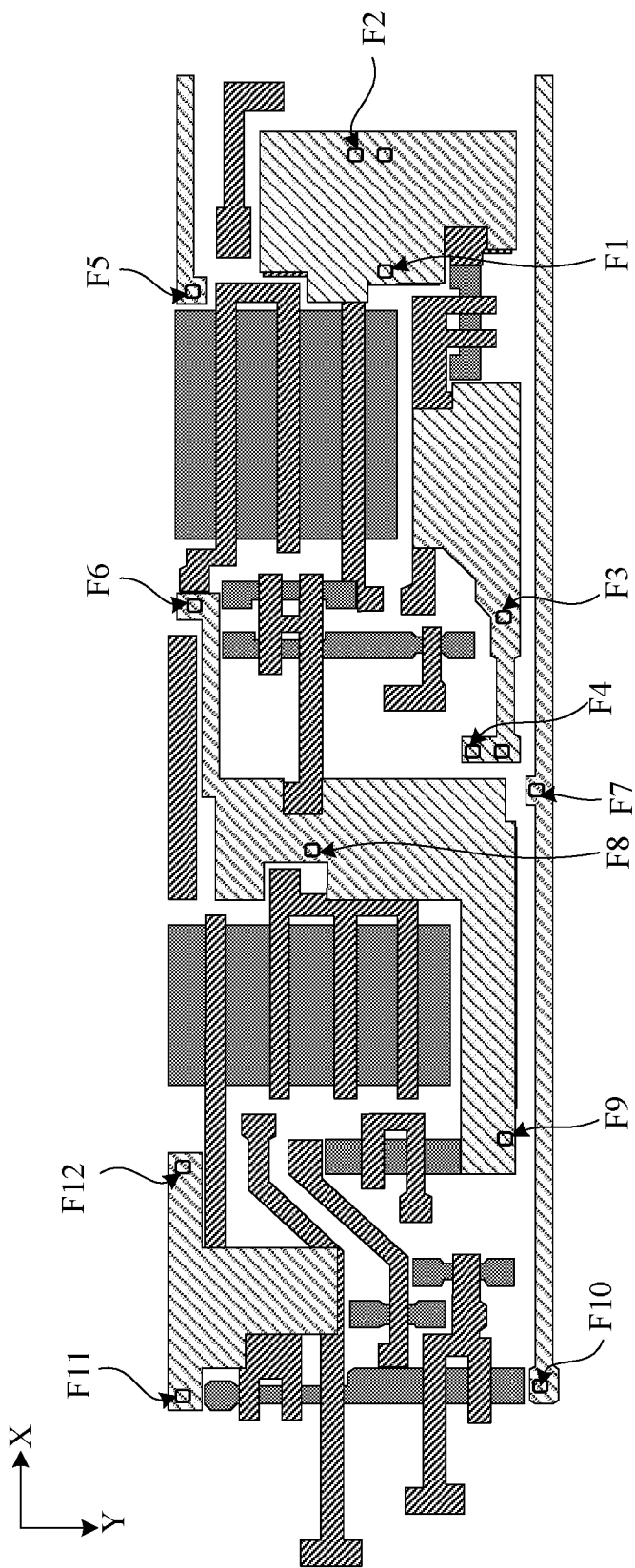
FIG. 6D is a top view of a shift register unit after a first via is formed in a fourth insulating layer according to at least one embodiment of the present disclosure.

FIG. 6D is a top view of a shift register unit after a first via is formed in a fourth insulating layer according to at least one embodiment of the present disclosure. As shown in FIGS. 3 to 6D, a plurality of first vias F1 to F12 are formed on the fourth insulating layer 14. The fourth insulating layer 14 in the plurality of first vias F1 to F12 is etched away to expose a surface of the second conductive layer.

Figure 6E:
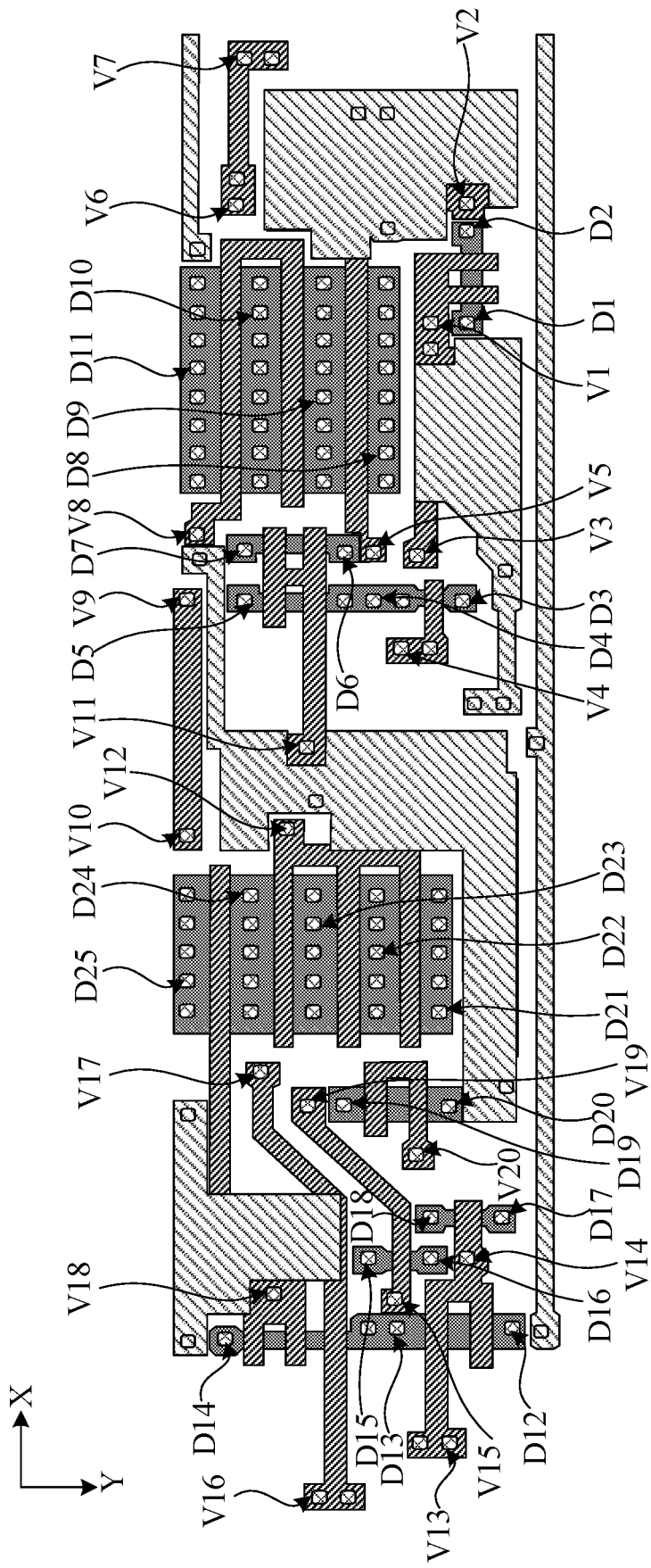
FIG. 6E is a top view of a shift register unit after a second via and a third via are formed in a fourth insulating layer according to at least one embodiment of the present disclosure.

FIG. 6E is a top view of a shift register unit after a second via and a third via are formed in a fourth insulating layer according to at least one embodiment of the present disclosure. As shown in FIGS. 3 to 6E, a plurality of second vias V1 to V20 and a plurality of third vias D1 to D25 are formed on the fourth insulating layer 14. The fourth insulating layer 14 and the third insulating layer 13 in the plurality of second vias V1 to V20 are etched away to expose a surface of the first conductive layer. The fourth insulating layer 14, the third insulating layer 13, and the second insulating layer 12 in the plurality of third vias D1 to D25 are etched away to expose a surface of the semiconductor layer.

Figure 6F:
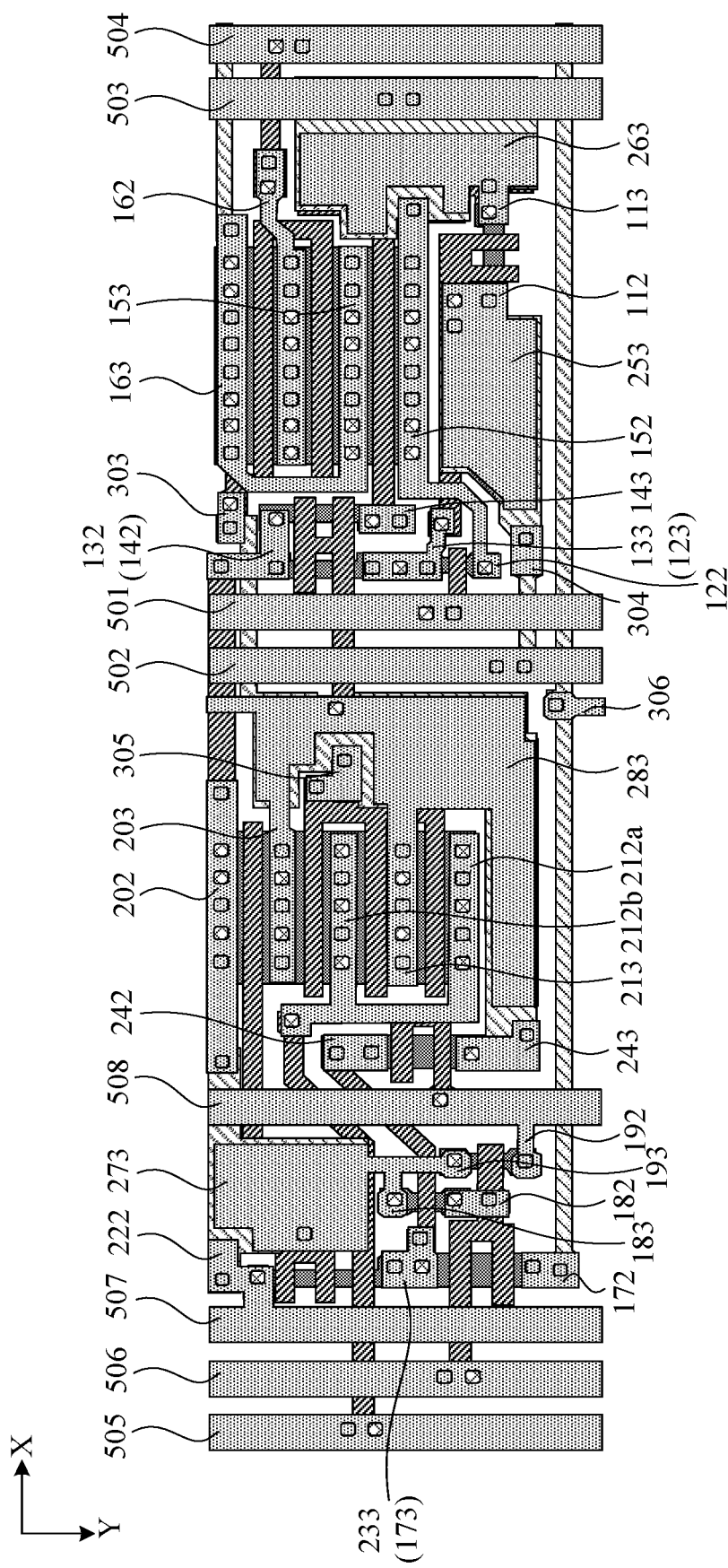
FIG. 6F is a top view of a shift register unit after a third conductive layer is formed according to at least one embodiment of the present disclosure.

FIG. 6F is a top view of a shift register unit after a third conductive layer is formed according to at least one embodiment of the present disclosure. As shown in FIGS. 3 to 6F, the third conductive layer may include: a first connection line 501, a second connection line 502, a third connection line 503, a fourth connection line 504, a fifth connection line 505, a sixth connection line 506, a seventh connection line 507, an eighth connection line 508, a third sub-electrode 253 of the first capacitor C1, a third sub-electrode 263 of the second capacitor C2, a third sub-electrode 273 of the third capacitor C3, a third sub-electrode 283 of the fourth capacitor C4, a first electrode 112 and a second electrode 113 of the first transistor T1, a first electrode 122 and a second electrode 123 of the second transistor T2, a first electrode 132 and a second electrode 133 of the third transistor T3, a first electrode 142 and a second electrode 143 of the fourth transistor T4, a first electrode 152 and a second electrode 153 of the fifth transistor T5, a first electrode 162 and a second electrode 163 of the sixth transistor T6, a first electrode 172 and a second electrode 173 of the seventh transistor T7, a first electrode 182 and a second electrode 183 of the eighth transistor T8, a first electrode 192 and a second electrode 193 of the ninth transistor T9, a first electrode 202 and a second electrode 203 of the tenth transistor T10, first electrodes 212a and 212b and a second electrode 213 of the eleventh transistor T11, a first electrode 222 of the twelfth transistor T12, a second electrode 233 of the thirteenth transistor T13, a first electrode 242 and a second electrode 243 of the fourteenth transistor T14, a third connection electrode 303, a fourth connection electrode 304, a fifth connection electrode 305, and a sixth connection electrode 306.

In some exemplary embodiments, the third sub-electrode 253 of the first capacitor C1 is overlapped with both the second sub-electrode 252 and the first sub-electrode 251. The third sub-electrode 263 of the second capacitor C2 is overlapped with both the second sub-electrode 262 and the first sub-electrode 261. The third sub-electrode 273 of the third capacitor C3 is overlapped with both the second sub-electrode 272 and the first sub-electrode 271. The third sub-electrode 283 of the fourth capacitor C4 is overlapped with both the second sub-electrode 282 and the first sub-electrode 281.

Figure 6G:
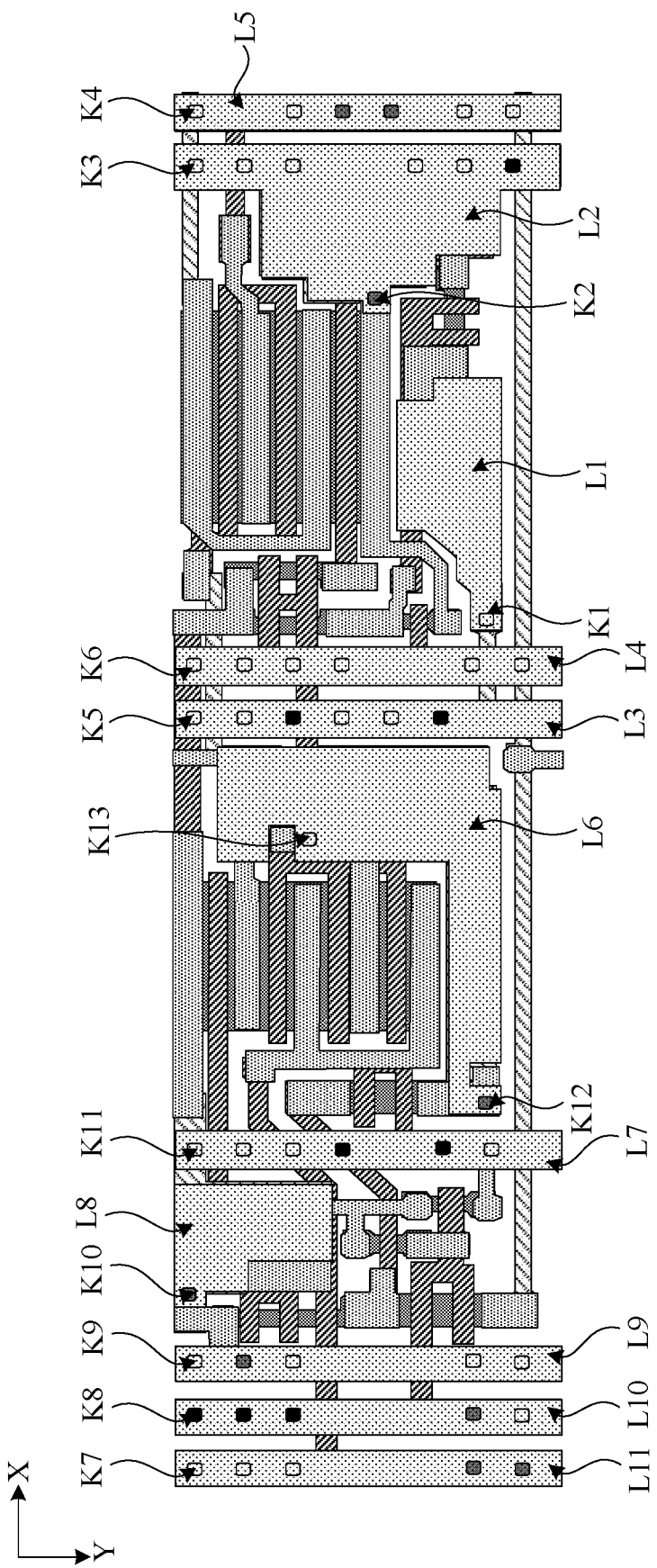
FIG. 6G is a top view of a shift register unit after a sixth insulating layer is formed according to at least one embodiment of the present disclosure.

FIG. 6G is a top view of a shift register unit after a sixth insulating layer is formed according to at least one embodiment of the present disclosure. As shown in FIGS. 3 to 6G, a plurality of grooves L1 to L11 are formed on the sixth insulating layer 16. The sixth insulating layer 16 in the plurality of grooves L1 to L11 is etched away to expose a surface of the fifth insulating layer 15. A plurality of fourth vias K1 to K13 are formed on the fifth insulating layer 15. The fifth insulating layer 15 in the plurality of fourth vias K1 to K13 is etched away to expose a surface of the third conductive layer.

Figure 6H:
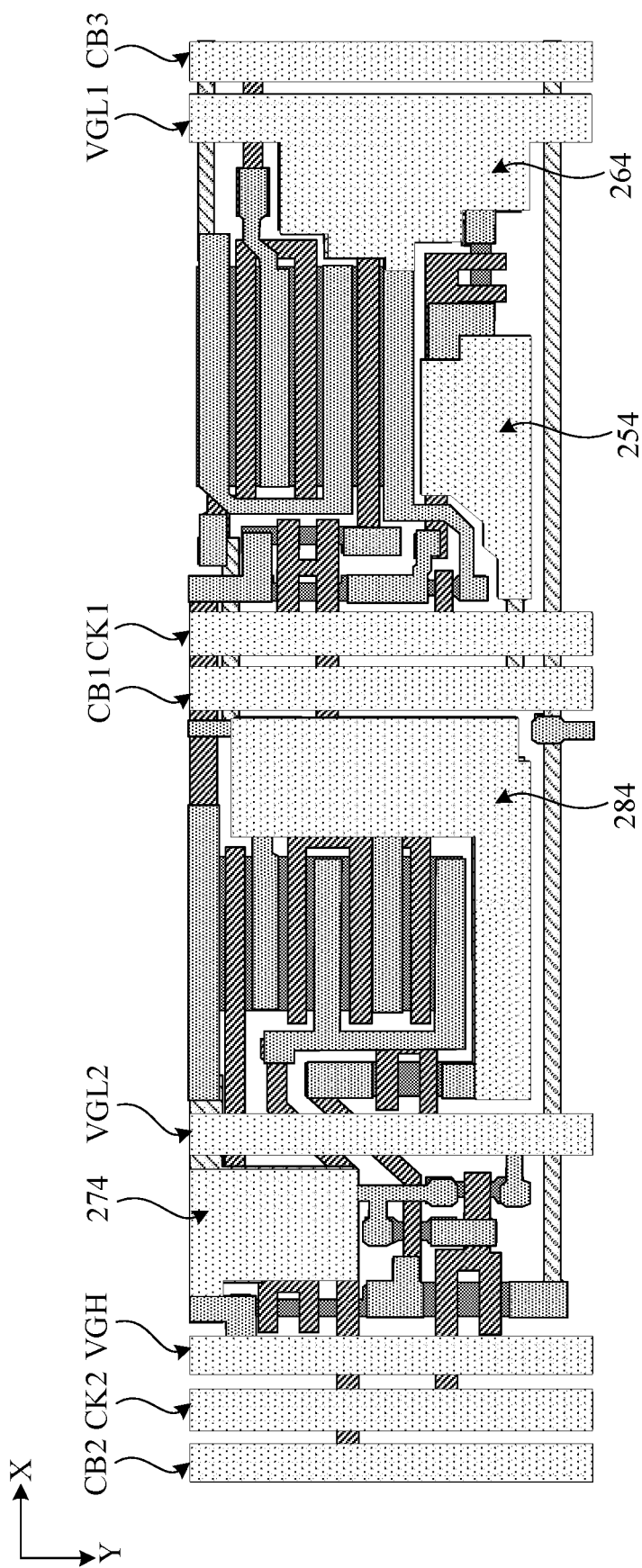
FIG. 6H is a top view of a shift register unit after a fourth conductive layer is formed according to at least one embodiment of the present disclosure.

FIG. 6H is a top view of a shift register unit after a fourth conductive layer is formed according to at least one embodiment of the present disclosure. As shown in FIGS. 3 to 6H, the fourth conductive layer may include: the first clock signal line CK1, the second clock signal line CB1, the third clock signal line CK2, the fourth clock signal line CB2, the fifth clock signal line CB3, the first power supply lines VGL1 and VGL2, the second power supply line VGH, a fourth sub-electrode 254 of the first capacitor C1, a fourth sub-electrode 264 of the second capacitor C2, a fourth sub-electrode 274 of the third capacitor C3, and a fourth sub-electrode 284 of the fourth capacitor C4.

In some exemplary embodiments, the fourth sub-electrode 254 of the first capacitor C1 is overlapped with the first sub-electrode 251, the second sub-electrode 252, and the third sub-electrode 253. The fourth sub-electrode 264 of the second capacitor C2 is overlapped with the first sub-electrode 261, the second sub-electrode 262, and the third sub-electrode 263. The fourth sub-electrode 274 of the third capacitor C3 is overlapped with the first sub-electrode 271, the second sub-electrode 272, and the third sub-electrode 273. The fourth sub-electrode 284 of the fourth capacitor C4 is overlapped with the first sub-electrode 281, the second sub-electrode 282, and the third sub-electrode 283.

In some exemplary embodiments, the first transistor T1 includes an active layer 110, control electrodes 111a and 111b, a first electrode 112, and a second electrode 113. The active layer 110 of the first transistor T1 includes channel regions 110a1, 110a2, and 110a3, a first doped region 110b, and a second doped region 110c. The control electrodes 111a and 111b of the first transistor T1 and the first sub-electrode 251 of the first capacitor C1 may be of an integrated structure. The first electrode 112 of the first transistor T1 may be connected to the first doped region 110b of the active layer 110 of the first transistor T1 through the third via D1 penetrating through the fourth insulating layer 14, the third insulating layer 13, and the second insulating layer 12. The first electrode 112 of the first transistor T1 may also be connected with the first sub-electrode 251 of the first capacitor C1 through two second vias V1 arranged side by side penetrating the fourth insulating layer 14 and the third insulating layer 13. An orthographic projection of the first electrode 112 of the first transistor T1 on the base substrate 10 is not overlapped with an orthographic projection of the channel regions 110a1, 110a2, and 110a3 of the active layer 110 of the first transistor T1 on the base substrate 10, which may protect the channel regions of the first transistor T1 and prevent a perforation position from damaging the channel regions. The first electrode 112 of the first transistor T1 and the third sub-electrode 253 of the first capacitor C1 may be of an integrated structure. The third sub-electrode 253 of the first capacitor C1 may be electrically connected with the first sub-electrode 251 through the second via V1. The third sub-electrode 253 and the first sub-electrode 251 of the first capacitor C1 are electrically connected as a first electrode of the first capacitor C1. The second electrode 113 of the first transistor T1 may be connected to the second doped region 110c of the active layer 110 of the first transistor T1 through the third via D2 penetrating through the fourth insulating layer 14, the third insulating layer 13, and the second insulating layer 12. The second electrode 113 of the first transistor T1 and the third sub-electrode 263 of the second capacitor C2 may be of an integrated structure.

In the embodiments of the present disclosure, "arranged side by side" may mean being arranged in sequence along the first direction X, and "arranged vertically" may mean being arranged in sequence along the second direction Y.

In some exemplary embodiments, the first capacitor C1 may include the first sub-electrode 251, the second sub-electrode 252, the third sub-electrode 253, and the fourth sub-electrode 254. The third sub-electrode 253 is connected with the first sub-electrode 251 through two second vias V1. The fourth sub-electrode 254 is connected with the fourth connection electrode 304 through the groove L1 and the fourth via K1, and the fourth connection electrode 304 is connected with the second sub-electrode 252 through the first via F3. The second sub-electrode 252 is connected with the second connection line 502 through two first vias F4 arranged vertically. The second connection line 502 is connected with the second clock signal line CB1 through the groove L3 and a plurality of fourth vias K5 arranged vertically (for example, six fourth vias K5 arranged vertically). The first sub-electrode 251 and the third sub-electrode 253 are electrically connected as a first electrode of the first capacitor C1; the second sub-electrode 252 and the fourth sub-electrode 254 are electrically connected as a second electrode of the first capacitor C1.

In some exemplary embodiments, the second capacitor C2 may include the first sub-electrode 261, the second sub-electrode 262, the third sub-electrode 263, and the fourth sub-electrode 264. The third sub-electrode 263 is connected with the first sub-electrode 261 through the second via V2. The fourth sub-electrode 264 is connected with the first electrode 152 of the fifth transistor T5 through the groove L2 and the fourth via K2, and the first electrode 152 of the fifth transistor T5 is connected with the second sub-electrode 262 through the first via F1. The second sub-electrode 262 is also connected with the third connection line 503 through two first vias F2 arranged vertically. The third connection line 503 is connected with the first power supply line VGL1 through the groove L2 and a plurality of fourth vias K3 arranged vertically. The fourth sub-electrode 264 and the first power supply line VGL1 may be of an integrated structure. The first sub-electrode 261 and the third sub-electrode 263 are electrically connected as a first electrode of the second capacitor C2; the second sub-electrode 262 and the fourth sub-electrode 264 are electrically connected as a second electrode of the second capacitor C2.

In some exemplary embodiments, the second transistor T2 may include an active layer 120, a control electrode 121, a first electrode 122, and a second electrode 123. The active layer 120 of the second transistor T2 includes a channel region 120a, a first doped region 120b, and a second doped region 120c. The control electrode 121 of the second transistor T2 is connected with the first connection line 501 through two second vias V4 arranged vertically. The first connection line 501 is connected with the first clock signal line CK1 through the groove L4 and a plurality of fourth vias K6 arranged vertically (for example, six fourth vias K6 arranged vertically). The first electrode 122 of the second transistor T2 is connected with the first doped region 120b of the active layer 120 of the second transistor T2 through the first via D3. The second electrode 123 of the second transistor T2 is connected with the second doped region 120c of the active layer 120 of the second transistor T2 through three third vias D4 arranged vertically and connected with the first sub-electrode 251 of the first capacitor C1 through the second via V3. The first electrode 122 of the second transistor T2 and the first electrode 152 of the fifth transistor T5 may be of an integrated structure. The second electrode 123 of the second transistor T2 and the second electrode 133 of the third transistor T3 may be of an integrated structure.

In some exemplary embodiments, the third transistor T3 may include an active layer 130, control electrodes 131a and 131b, a first electrode 132, and a second electrode 133. The active layer 130 of the third transistor T3 includes channel regions 130a1, 130a2, and 130a3, a first doped region 130b, and a second doped region 130c. The active layer 130 of the third transistor T3 and the active layer 120 of the second transistor T2 form an integrated structure, and the second doped region 130c of the third transistor T3 is connected with the second doped region 120c of the second transistor T2. The first electrode 132 of the third transistor T3 is connected with the first doped region 130b of the active layer 130 of the third transistor T3 through the third via D5 and connected with the second connection electrode 302 through the second via V9. The first electrode 132 of the third transistor T3 and the first electrode 142 of the fourth transistor T4 may form an integrated structure.

In some exemplary embodiments, the fourth transistor T4 may include an active layer 140, control electrodes 141a and 141b, a first electrode 142, and a second electrode 143. The active layer 140 of the fourth transistor T4 includes channel regions 140a1, 140a2, and 140a3, a first doped region 140b, and a second doped region 140c. The first electrode 142 of the fourth transistor T4 is connected with the first doped region 140b of the active layer 140 of the fourth transistor T4 through the third via D7. The second electrode 143 of the fourth transistor T4 is connected with the second doped region 140c of the fourth transistor T4 through the third via D6 and connected with the control electrode 151 of the fifth transistor T5 through the second via V5.

In some exemplary embodiments, the fifth transistor T5 may include an active layer 150, a control electrode 151, a first electrode 152, and a second electrode 153. The active layer 150 of the fifth transistor T5 includes a channel region 150a, a first doped region 150b, and a second doped region 150c. The active layer 150 of the fifth transistor T5 and the active layer 160 of the sixth transistor T6 form an integrated structure, and the second doped region 150c of the fifth transistor T5 is connected with a third doped region 160d of the sixth transistor T6. The first electrode 152 of the fifth transistor T5 is connected with the first doped region 150b of the active layer 150 of the fifth transistor T5 through a plurality of third vias D8 arranged side by side (for example, eight third vias D8 arranged side by side) and connected with the second sub-electrode 262 of the second capacitor C2 through the first via F1. The second electrode 153 of the fifth transistor T5 is connected with the second doped region 150c of the active layer 150 of the fifth transistor T5 through a plurality of third vias D9 arranged side by side (for example, eight third vias D9 arranged side by side). The first electrode 152 of the fifth transistor T5 and the first electrode 122 of the second transistor T2 may be of an integrated structure. The second electrode 153 of the fifth transistor T5 and the second electrode 163 of the sixth transistor T6 may be of an integrated structure.

In some exemplary embodiments, the sixth transistor T6 may include an active layer 160, control electrodes 161a and 161b, a first electrode 162, and a second electrode 163. The active layer 160 of the sixth transistor T6 includes channel regions 160a1 and 160a2, a first doped region 160b, a second doped region 160c, and a third doped region 160d. The third connection electrode 303 is connected with the second sub-electrode 282 of the fourth capacitor C4 through the first via F6, and connected with the first control electrode 161a of the sixth transistor T6 through the second via V8. The second sub-electrode 282 of the fourth capacitor C4 is connected with the second electrode 243 of the fourteenth transistor T14 through the first via F9. The first control electrode 161a of the sixth transistor T6 is connected with the second electrode 243 of the fourteenth transistor T14 through the third connection electrode 303 and the second sub-electrode 282 of the fourth capacitor C4. The third doped region 160d of the sixth transistor T6 is connected with the second doped region 150c of the fifth transistor T5. The first electrode 162 of the sixth transistor T6 is connected with the first doped region 160b of the active layer 160 of the sixth transistor T6 through a plurality of third vias D10 arranged side by side (for example, eight third vias D10 arranged side by side) and connected with the first connection electrode 301 through two second vias V6 arranged side by side. The first connection electrode 301 is connected with the fourth connection line 504 through two second vias V7 arranged vertically. The fourth connection line 504 is connected with the third clock signal line CB3 through the groove L5 and a plurality of fourth vias K4. The second electrode 163 of the sixth transistor T6 is connected with the second doped region 160c of the active layer 160 of the sixth transistor T6 through a plurality of third vias D11 arranged side by side (for example, eight third vias D11 arranged side by side), and connected with the second output terminal Gout through the first via F5. The second electrode 153 of the fifth transistor T5 and the second electrode 163 of the sixth transistor T6 may be of an integrated structure.

In some exemplary embodiments, the seventh transistor T7 may include an active layer 170, control electrodes 171a and 171b, a first electrode 172, and a second electrode 173. The active layer 170 of the seventh transistor T7 includes channel regions 170a1, 170a2, and 170a3, a first doped region 170b, and a second doped region 170c. The active layer 170 of the seventh transistor T7 and the active layer 230 of the thirteenth transistor T13 form an integrated structure, and the second doped region 170c of the seventh transistor T7 is connected with the second doped region 230c of the thirteenth transistor T13. The control electrode 171a of the seventh transistor T7 is connected with the sixth connection line 506 through two second vias V13 arranged vertically. The sixth connection line 506 is connected with the third clock signal line CK2 through the groove L10 and a plurality of fourth vias K8 arranged vertically (for example, five fourth vias K8 arranged vertically). The first electrode 172 of the seventh transistor T7 is connected with the first doped region 170b of the active layer 170 of the seventh transistor T7 through the third via D12 and connected with the input terminal INPUT through the first via F10. The input terminal INPUT is connected with the sixth connection electrode 306 through the first via F7. The sixth connection electrode 306 may be connected with a first output terminal of a previous stage shift register unit to receive an input signal. The second electrode 173 of the seventh transistor T7 is connected with the second doped region 170c of the active layer 170 of the seventh transistor T7 through the third via D13, connected with the second doped region 230c of the active layer 230 of the thirteenth transistor T13 through the third via D13, and connected with the control electrode 181 of the eighth transistor T8 through the second via V15. The second electrode 173 of the seventh transistor T7 and the second electrode 233 of the thirteenth transistor T13 may form an integrated structure.

In some exemplary embodiments, the eighth transistor T8 may include an active layer 180, a control electrode 181, a first electrode 182, and a second electrode 183. The active layer 180 of the eighth transistor T8 includes a channel region 180a, a first doped region 180b, and a second doped region 180c. The first electrode 182 of the eighth transistor T8 is connected with the first doped region 180b of the active layer 180 of the eighth transistor T8 through the third via D16 and connected with the control electrode 191 of the ninth transistor T9 through the second via V14. Because the control electrode 191 of the ninth transistor T9 and the control electrodes 171a and 171b of the seventh transistor T7 form an integrated structure, and the control electrode 171a of the seventh transistor T7 is connected with the third clock signal line CK2 through the sixth connection line 506, thus the first electrode 182 of the eighth transistor T8 may be electrically connected with the third clock signal line CK2 through the control electrode 191 of the ninth transistor T9. The second electrode 183 of the eighth transistor T8 is connected with the second doped region 180c of the active layer 180 of the eighth transistor T8 through the third via D15. The second electrode 183 of the eighth transistor T8, the second electrode 192 of the ninth transistor T9, and the third sub-electrode 273 of the third capacitor C3 may form an integrated structure.

In some exemplary embodiments, the ninth transistor T9 may include an active layer 190, a control electrode 191, a first electrode 192, and a second electrode 193. The active layer 190 of the ninth transistor T9 includes a channel region 190a, a first doped region 190b, and a second doped region 190c. The first electrode 192 of the ninth transistor T9 is connected with the first doped region 190b of the active layer 190 of the ninth transistor T9 through the third via D17. The second electrode 193 of the ninth transistor T9 is connected with the second doped region 190c of the active layer 190 of the ninth transistor T9 through the third via D18. The first electrode 192 of the ninth transistor T9 and the eighth connection line 508 may be of an integrated structure. The eighth connection line 508 is connected with the first power supply line VGL2 through the groove L7 and a plurality of fourth vias K11 arranged vertically (for example, six fourth vias K11 arranged vertically).

In some exemplary embodiments, the tenth transistor T10 may include an active layer 200, a control electrode 201, a first electrode 202, and a second electrode 203. The active layer 200 of the tenth transistor T10 includes a channel region 200a, a first doped region 200b, and a second doped region 200c. The active layer 200 of the tenth transistor T10 and the active layer 210 of the eleventh transistor T11 are of an integrated structure, and the second doped region 200c of the tenth transistor T10 is connected with a fourth doped region 210e of the eleventh transistor T11. The first electrode 202 of the tenth transistor T10 is connected with the first doped region 200b of the active layer 200 of the tenth transistor T10 through a plurality of third vias D25 arranged side by side (for example, five third vias D25 arranged side by side), connected with the second sub-electrode 272 of the third capacitor C3 through the first via F12, and connected with the second connection electrode 302 through the second via V10. The second electrode 203 of the tenth transistor T10 is connected with the second doped region 200c of the active layer 200 of the tenth transistor T10 through a plurality of third vias D24 side by side (for example, five third vias D24 arranged side by side). The second electrode 203 of the tenth transistor T10, the second electrode 213 of the eleventh transistor T11, and the third electrode 283 of the fourth capacitor C4 may be of an integrated structure. The integrated structure may be used as a first output terminal to provide an input signal to an input terminal of a next stage shift register unit. However, this embodiment is not limited to this.

In some exemplary embodiments, the eleventh transistor T11 may include an active layer 210, control electrodes 211a, 211b, and 211c, first electrodes 212a and 212b, and a second electrode 213. The active layer 210 of the eleventh transistor T11 includes channel regions 210a1, 210a2, and 210a3, a first doped region 210b, a second doped region 210c, a third doped region 210d, and a fourth doped region 210e. The fourth doped region 210e is connected with the second doped region 200c of the tenth transistor T10. The control electrodes 211a, 211b, and 211c of the eleventh transistor T11 form an integrated structure and are connected with the fifth connection electrode 305 through the second via V12. The fifth connection electrode 305 is connected with the second sub-electrode 282 of the fourth capacitor C4 through the first via F8. The fifth connection electrode 305 is connected with the fourth sub-electrode 284 of the fourth capacitor C4 through the groove L6 and the fourth via K13. The first electrode 212a of the eleventh transistor T11 is connected with the first doped region 210b of the active layer 210 of the eleventh transistor T11 through a plurality of third vias D21 arranged side by side (for example, five third vias D21 arranged side by side). The first electrode 212b of the eleventh transistor T11 is connected with the third doped region 210d of the active layer 210 of the eleventh transistor T11 through a plurality of third vias D23 arranged side by side. The first electrodes 212a and 212b of the eleventh transistor T11 may be of an integrated structure and are connected with the control electrode 231 of the thirteenth transistor T13 through the second via V17. The control electrode 231 of the thirteenth transistor T13 is connected with the fifth connection line 505 through two second vias V16 arranged vertically. The fifth connection line 505 is connected with the fourth clock signal line CB2 through the groove L11 and a plurality of fourth vias K7 arranged vertically (for example, five fourth vias K7 arranged vertically). The second electrode 213 of the eleventh transistor T11 is connected with the second doped region 210c of the active layer 210 of the eleventh transistor T11 through a plurality of third vias D22 arranged side by side (for example, five third vias D22 arranged side by side). The second electrode 203 of the tenth transistor T10, the second electrode 213 of the eleventh transistor T11, and the third electrode 283 of the fourth capacitor C4 may form an integrated structure.

In some exemplary embodiments, the twelfth transistor T12 may include an active layer 220, control electrodes 221a and 221b, and a first electrode 222. The active layer 220 of the twelfth transistor T12 includes channel regions 220a1, 220a2, and 220a3, a first doped region 220b, and a second doped region 220c. The active layer 220 of the twelfth transistor T12 and the active layer 230 of the thirteenth transistor T13 form an integrated structure, and the second doped region 220c of the twelfth transistor T12 is connected with the first doped region 230b of the thirteenth transistor T13. The first electrode 222 of the twelfth transistor T12 is connected with the first doped region 220b of the active layer 220 of the twelfth transistor T12 through the third via D14 and connected with the second sub-electrode 272 of the third capacitor C3 through the first via F11. The first electrode 222 of the twelfth transistor T12 and the seventh connection line 507 may form an integrated structure. The seventh connection line 507 may be connected with the second power supply line VGH through the groove L9 and a plurality of fourth vias K9 arranged vertically (for example, five fourth vias K9 arranged vertically).

In some exemplary embodiments, the thirteenth transistor T13 may include an active layer 230, a control electrode 231, and a second electrode 233. The active layer 230 of the thirteenth transistor T13 includes a channel region 230a, a first doped region 230b, and a second doped region 230c. The control electrode 231 of the thirteenth transistor T13 is connected with the fifth connection line 505 through two second vias V16, and the fifth connection line 505 is connected with the fourth clock signal line CB2 through the groove L11 and a plurality of fourth vias K7. The second electrode 233 of the thirteenth transistor T13 and the second electrode 173 of the seventh transistor T7 form an integrated structure.

In some exemplary embodiments, the fourteenth transistor T14 may include an active layer 240, control electrodes 241a and 241b, a first electrode 242, and a second electrode 243. The active layer 240 of the fourteenth transistor T14 includes channel regions 240a1, 240a2, and 240a3, a first doped region 240b, and a second doped region 240c. The control electrode 241b of the fourteenth transistor T14 is connected with the eighth connection line 508 through the second via V20. The eighth connection line 508 is connected with the first power supply line VGL2 through the groove L7 and a plurality of fourth vias K11. The first electrode 242 of the fourteenth transistor T14 is connected with the first doped region 240b of the active layer 240 of the fourteenth transistor T14 through the third via D19 and connected with the control electrode 181 of the eighth transistor T8 through the second via V19. The second electrode 243 of the fourteenth transistor T14 is connected with the second doped region 240c of the active layer 240 of the fourteenth transistor T14 through the third via D20 and connected with the second sub-electrode 282 of the fourth capacitor C4 through the first via F9.

In some exemplary embodiments, the fourth capacitor C4 may include the first sub-electrode 281, the second sub-electrode 282, the third sub-electrode 283, and the fourth sub-electrode 284. The first sub-electrode 281 is connected with the third sub-electrode 283 through the second via V11. The fourth sub-electrode 284 is connected with the second electrode 243 of the fourteenth transistor T14 through the groove L6 and the fourth via K12, and the second electrode 243 of the fourteenth transistor T14 is connected with the second sub-electrode 282 through the first via F9. The fourth sub-electrode 284 is also connected with the fifth connection electrode 305 through the groove L6 and the fourth via K13, and the fifth connection electrode 305 is connected with the second sub-electrode 282 through the first via F8. The first sub-electrode 281 and the third sub-electrode 283 are electrically connected as a first electrode of the fourth capacitor C4; and the second sub-electrode 282 and the fourth sub-electrode 284 are electrically connected as a second electrode of the fourth capacitor C4.

In some exemplary embodiments, the third capacitor C3 may include the first sub-electrode 271, the second sub-electrode 272, the third sub-electrode 273, and the fourth sub-electrode 274. The third sub-electrode 273 is connected with the first sub-electrode 271 through the second via V18. The fourth sub-electrode 274 is connected with the first electrode 222 of the twelfth transistor T12 through the groove L8 and the fourth via K10, and the first electrode 222 of the twelfth transistor T12 is connected with the second sub-electrode 272 through the first via F11. The first sub-electrode 271 and the third sub-electrode 273 are electrically connected as a first electrode of the third capacitor C3; and the second sub-electrode 272 and the fourth sub-electrode 274 are electrically connected as a second electrode of the third capacitor C3.

In some exemplary embodiments, the third sub-electrode 273 of the third capacitor C3, the second electrode 183 of the eighth transistor T8, and the second electrode 193 of the ninth transistor T9 may be of an integrated structure. The second electrode 203 of the tenth transistor T10, the second electrode 213 of the eleventh transistor T11, and the third sub-electrode 283 of the fourth capacitor C4 may be of an integrated structure.

In this exemplary embodiment, a four-stacked structure may be adopted for the first capacitor C1 to the fourth capacitor C4. However, this embodiment is not limited to this. For example, a double-stacked structure or a triple-stacked structure may be adopted for at least one of the first capacitor to the fourth capacitor.

The structure of the display substrate will now be described through an example of a preparation process of the display substrate. A "patterning process" mentioned in the present disclosure includes film layer deposition, coating with a photoresist, masking, exposure, development, etching, photoresist stripping, and other treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film made from a certain material on a substrate by a deposition or coating process. If the patterning process is not needed by the "thin film" in the whole making process, the "thin film" may also be called a "layer". When the patterning process is needed by the "thin film" in the whole making process, the thin film is called a "thin film" before the patterning process and called a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the film layer is a size of the film layer in a direction perpendicular to the display substrate. In the exemplary embodiment of the present disclosure, "the projection of A includes the projection of B" refers to that a boundary of the projection of B falls within a range of a boundary of the projection of A or the boundary of the projection of A is overlapped with the boundary of the projection of B.

A preparation process of a display substrate according to this exemplary embodiment may include following acts.

(1) A base substrate is provided.

In some exemplary embodiments, a base substrate 10 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber.

(2) A pattern of a semiconductor layer is formed.

In some exemplary embodiments, a first insulating thin film and a semiconductor thin film are sequentially deposited on the base substrate 10, and the semiconductor thin film is patterned through a patterning process to form a first insulating layer 11 covering the whole base substrate 10 and the pattern of the semiconductor layer arranged on the first insulating layer 11, as shown in FIG. 6A. The pattern of the semiconductor layer at least includes active layers of a plurality of transistors (for example, a first transistor T1 to a fourteenth transistor T14) in a shift register unit. An active layer may include at least one channel region and a plurality of doped regions. The channel region may not be doped with impurities, and has characteristics of a semiconductor. A doped region is doped with impurities and therefore has conductivity. An impurity may change according to a type (e.g., an N type or a P type) of a transistor. In some examples, a material of the semiconductor thin film may be polysilicon.

(3) A pattern of a first conductive layer is formed.

In some exemplary embodiments, a second insulating thin film and a first conductive thin film are sequentially deposited on the base substrate 10 where the aforementioned pattern is formed, and the first conductive thin film is patterned through a patterning process to form a second insulating layer 12 covering the pattern of the semiconductor layer and form the pattern of the first conductive layer arranged on the second insulating layer 12, as shown in FIG. 6B. In some examples, the pattern of the first conductive layer at least includes control electrodes of a plurality of transistors (for example, the first transistor T1 to the fourteenth transistor T14) of the shift register unit, first sub-electrodes of a plurality of capacitors (for example, a first capacitor C1 to a fourth capacitor C4) of the shift register unit, and a plurality of connection electrodes (for example, a first connection electrode 301 and a second connection electrode 302).

(4) A pattern of a second conductive layer is formed.

In some exemplary embodiments, a third insulating thin film and a second conductive thin film are sequentially deposited on the base substrate 10 where the aforementioned patterns are formed, and the second conductive thin film is patterned through a patterning process to form a third insulating layer 13 covering the first conductive layer and form the pattern of the second conductive layer arranged on the third insulating layer 13, as shown in FIG. 6C. In some examples, the pattern of the second conductive layer at least includes second sub-electrodes of a plurality of capacitors (for example, the first capacitor C1 to the fourth capacitor C4) of the shift register unit, an input terminal INPUT, and a second output terminal Gout.

(5) A pattern of a fourth insulating layer is formed.

In some exemplary embodiments, a fourth insulating thin film is deposited on the base substrate 10 where the aforementioned patterns are formed, and the fourth insulating thin film is patterned through a patterning process to form the pattern of the fourth insulating layer 14 covering the second conductive layer, as shown in FIGS. 6D and 6E. In some examples, a plurality of vias are opened on the fourth insulating layer 14. The plurality of vias at least include a plurality of first vias F1 to F12, a plurality of second vias V1 to V20, and a plurality of third vias D1 to D25. The fourth insulating layer 14 in the plurality of first vias F1 to F12 is etched away to expose a surface of the second conductive layer. The fourth insulating layer 14 and the third insulating layer 13 in the plurality of second vias V1 to V20 are etched away to expose a surface of the first conductive layer. The fourth insulating layer 14, the third insulating layer 13, and the second insulating layer 12 in the plurality of third vias D1 to D25 are etched away to expose a surface of the semiconductor layer.

(6) A pattern of a third conductive layer is formed.

In some exemplary embodiments, a third conductive thin film is deposited on the base substrate 10 where the aforementioned patterns are formed, and the third conductive thin film is patterned through a patterning process to form the pattern of the third conductive layer on the fourth insulating layer 14, as shown in FIG. 6F. In some examples, the pattern of the third conductive layer at least includes third sub-electrodes of a plurality of capacitors (for example, the first capacitor C1 to the fourth capacitor C4) of the shift register unit, first and second electrodes of a plurality of transistors (for example, the first transistor T1 to the fourteenth transistor T14) of the shift register unit, a plurality of connection lines (for example, the first connection line 501 to the eighth connection line 508), and a plurality of connection electrodes (for example, the third connection electrode 303, the fourth connection electrode 304, the fifth connection electrode 305, and the sixth connection electrode 306).

(7) Patterns of a fifth insulating layer and a sixth insulating layer are formed.

In some exemplary embodiments, a fifth insulating thin film is deposited on the base substrate 10 where the aforementioned patterns are formed, and then a sixth insulating thin film is coated, and the pattern of the sixth insulating layer 16 is formed by masking, exposing, and developing the sixth insulating thin film; subsequently, the fifth insulating thin film is patterned to form the pattern of the fifth insulating layer 15, as shown in FIG. 6G. A plurality of grooves L1 to L11 are formed on the sixth insulating layer 16, and the sixth insulating layer 16 in the plurality of grooves L1 to L11 is etched away to expose a surface of the fifth insulating layer 15. A plurality of fourth vias K1 to K13 are formed on the fifth insulating layer 15, and the fifth insulating layer 15 in the plurality of fourth vias K1 to K13 is etched away to expose a surface of the third conductive layer. An orthographic projection of the grooves L1 to L11 on the base substrate 10 covers an orthographic projection of the plurality of fourth vias K1 to K13 on the base substrate 10.

(8) A pattern of a fourth conductive layer is formed.

In some exemplary embodiments, a fourth conductive thin film is deposited on the base substrate 10 where the aforementioned patterns are formed, and the fourth conductive thin film is patterned through a patterning process to form the pattern of the fourth conductive layer on the sixth insulating layer 16, as shown in FIG. 6H. In some examples, the pattern of the fourth conductive layer at least includes a first clock signal line CK1, a second clock signal line CB1, a third clock signal line CK2, a fourth clock signal line CB2, a fifth clock signal line CB3, first power supply lines VGL1 and VGL2, a second power supply line VGH, and fourth sub-electrodes of a plurality of capacitors (for example, the first capacitor C1 to the fourth capacitor C4) of the shift register unit.

In some exemplary embodiments, while a shift register unit is formed in a non-display region, a pixel drive circuit may be formed in a display region. For example, a semiconductor layer of a display region may include an active layer of a transistor of a pixel drive circuit, a first conductive layer of the display region may include a control electrode of the transistor of the pixel drive circuit and a first electrode of a storage capacitor, a second conductive layer of the display region may include a second electrode of the storage capacitor of the pixel drive circuit, a third conductive layer of the display region may include a first electrode and a second electrode of the transistor of the pixel drive circuit, and a fourth conductive layer of the display region may include a connection electrode between the pixel drive circuit and an anode of a light emitting element. After the fourth conductive layer is formed, patterns of a seventh insulating layer, an anode layer, a pixel define layer, an organic light emitting layer, a cathode layer, and an encapsulation layer may be sequentially formed in the display region. In some examples, on the base substrate where the aforementioned patterns are formed, a seventh insulating thin film is coated, and a pattern of a seventh insulating layer is formed by masking, exposing, and developing the seventh insulating thin film. Then, an anode thin film is deposited on the base substrate where the aforementioned patterns are formed, and the anode thin film is patterned through a patterning process to form an anode pattern on the seventh insulating layer. Next, on the base substrate where the aforementioned patterns are formed, a pixel define thin film is coated, and a pattern of a Pixel Define Layer (PDL) is formed through masking, exposure, and development processes. The pixel define layer is formed in each sub-pixel in the display region. A pixel opening exposing an anode is formed in the pixel define layer in each sub-pixel. Subsequently, the organic light emitting layer connected with the anode is formed in the aforementioned pixel opening. Subsequently, a cathode thin film is deposited and patterned through a patterning process to form a pattern of a cathode. The cathode is connected with the organic light emitting layer and the second power supply line respectively. Subsequently, the encapsulation layer is formed on the cathode. The encapsulation layer may include a stacked structure of an inorganic material/an organic material/an inorganic material. In some possible embodiments, the cathode may be connected with the second power supply line through a plurality of manners, such as laser drilling.

In some exemplary embodiments, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be in a single-layer structure, or a multilayer composite structure such as Mo/Cu/Mo. The first insulating layer 11, the second insulating layer 12, the third insulating layer 13, the fourth insulating layer 14, and the fifth insulating layer 15 may be made of any one or more of silicon oxide (SiOx), silicon nitride (SiNx), and silicon oxynitride (SiON), and may be single-layer, multilayer, or composite. The sixth insulating layer 16 and the seventh insulating layer may be made of an organic material, such as polyimide, acrylic, or polyethylene terephthalate. The first insulating layer 11 may be referred to as a buffer layer, the first insulating layer 11 is configured to improve water and oxygen resistance of the base substrate 10, the second insulating layer 12 and the third insulating layer 13 are referred to as gate insulating (GI) layers, the fourth insulating layer 14 is referred to as an interlayer insulating (ILD) layer, and the fifth insulating layer 15 is referred to as a passivation (PVX) layer; the sixth insulating layer 16 and the seventh insulating layer are referred to as planarization layers. The pixel define layer may be made of an organic material, such as polyimide, acrylic, or polyethylene terephthalate. The anode may be made of a transparent conductive material, e.g., indium tin oxide (ITO) or indium zinc oxide (IZO). The cathode may be made of any one or more of Magnesium (Mg), Argentum (Ag), Aluminum (Al), Copper (Cu), and Lithium (Li), or an alloy made of any one or more of the aforementioned metals. However, this embodiment is not limited to this. For example, the anode may be made of a reflective material such as a metal, and the cathode may be made of a transparent conductive material.

The structure shown in the exemplary embodiment and the preparation process thereof are merely illustrative. In some exemplary embodiments, changes in corresponding structures and, addition or deletion of patterning processes may be made according to actual needs. For example, the first clock signal line CK1, the second clock signal line CB1, the third clock signal line CK2, the fourth clock signal line CB2, the fifth clock signal line CB3, the first power supply lines VGL1 and VGL2, and the second power supply line VGH may be directly formed on the third conductive layer without providing the fourth conductive layer, and a double-stacked electrode structure or a triple-stacked electrode structure may be adopted for the first capacitor C1 to the fourth capacitor C4. However, this embodiment is not limited to this.

The preparation process of the exemplary embodiment may be implemented using an existing mature preparation device, and is compatible well with an existing preparation process, simple in process implementation, easy to implement, high in production efficiency, low in production cost, and high in yield.

According to the display substrate provided by this exemplary embodiment, the first capacitor C1 and the second capacitor C2 in a charge pump structure are set close to the first transistor T1, which may improve a layout density of the shift register unit, which is beneficial for achieving a narrow bezel. Furthermore, the first clock signal line CK1 and the second clock signal line CB1 are located between the fourth capacitor C4 of the input sub-circuit and the first capacitor C1 of the denoising control unit, which may minimize load of the first clock signal line CK1 and the second clock signal line CB1, which is beneficial to reduce durations of a rising edge and a falling edge of the shift register unit, thereby improving performance of the shift register unit.

An embodiment of the present disclosure further provides a preparation method of a display substrate, which is used for preparing the display substrate described above. The preparation method includes: providing a base substrate and forming a gate drive circuit in a non-display region. The gate drive circuit includes a plurality of cascaded shift register units; a shift register unit includes an input sub-circuit and a denoising output sub-circuit. The denoising output sub-circuit is connected with the input sub-circuit, a first group of clock signal lines, and a second group of clock signal lines, and the input sub-circuit is connected with a third group of clock signal lines. The third group of clock signal lines, the input sub-circuit, the first group of clock signal lines, the denoising output sub-circuit, and the second group of clock signal lines are sequentially arranged along a first direction.

In some exemplary embodiments, the denoising output sub-circuit includes a denoising control unit, and the first group of clock signal lines includes a first clock signal line and a second clock signal line. The denoising control unit at least includes a first transistor, a second transistor, a third transistor, a fourth transistor, a first capacitor, and a second capacitor. A control electrode and a first electrode of the first transistor are connected with a second denoising control node, and a second electrode of the first transistor is connected with a first denoising control node. A control electrode of the second transistor is connected with the first clock signal line, a first electrode of the second transistor is connected with a first power supply line, and a second electrode of the second transistor is connected with the second denoising control node. A first electrode of the first capacitor is connected with the second denoising control node, and a second electrode of the first capacitor is connected with the second clock signal line. A first electrode of the second capacitor is connected with the first denoising control node, and a second electrode of the second capacitor is connected with the first power supply line. The first capacitor and the second capacitor are located on opposite sides of the first transistor respectively, and the second transistor is located on a side of the first capacitor away from the first transistor. A control electrode of the third transistor is connected with a first output terminal, a first electrode of the third transistor is connected with a second power supply line, and a second electrode of the third transistor is connected with the second denoising control node. A control electrode of the fourth transistor is connected with the first output terminal, a first electrode of the fourth transistor is connected with the second power supply line, and a second electrode of the fourth transistor is connected with the first denoising control node.

In this exemplary embodiment, forming the gate drive circuit includes: sequentially forming a first insulating layer and a semiconductor layer on the base substrate; sequentially forming a second insulating layer and a first conductive layer; sequentially forming a third insulating layer and a second conductive layer; sequentially forming a fourth insulating layer and a third conductive layer; and sequentially forming a fifth insulating layer, a sixth insulating layer, and a fourth conductive layer. The semiconductor layer at least includes active layers of the first transistor to the fourth transistor. The first conductive layer at least includes control electrodes of the first transistor to fourth transistor, a first sub-electrode of the first capacitor, and a first sub-electrode of the second capacitor. The second conductive layer at least includes a second sub-electrode of the first capacitor and a second sub-electrode of the second capacitor. The third conductive layer at least includes a third sub-electrode of the first capacitor, a third sub-electrode of the second capacitor, first electrode and second electrode of the first transistor to fourth transistor, a first connection line, a second connection line, and a third connection line. The fourth conductive layer at least includes a fourth sub-electrode of the first capacitor, a fourth sub-electrode of the second capacitor, the first clock signal line connected with the first connection line, the second clock signal line connected with the second connection line, and the first power supply line connected with the third connection line. The first sub-electrode and the third sub-electrode of the first capacitor are connected as a first electrode of the first capacitor, and the second sub-electrode and the fourth sub-electrode of the first capacitor are connected as a second electrode of the first capacitor. The first sub-electrode and the third sub-electrode of the second capacitor are connected as a first electrode of the second capacitor, and the second sub-electrode and the fourth sub-electrode of the second capacitor are connected as a second electrode of the second capacitor.

Regarding the preparation method for the display substrate in this embodiment, reference may be made to description of the aforementioned embodiments, so it will not be repeated here.

Figure 7:
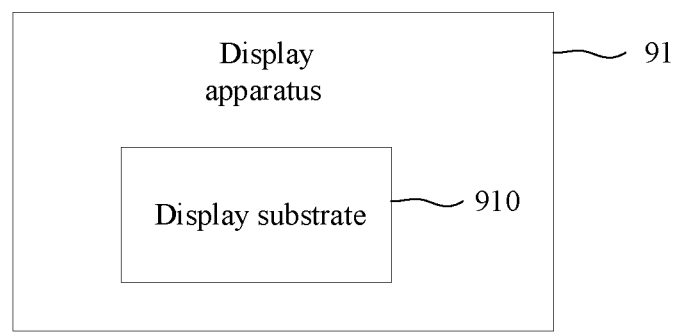
FIG. 7 is a schematic diagram of a display apparatus according to at least one embodiment of the present disclosure.

FIG. 7 is a schematic diagram of a display apparatus according to at least one embodiment of the present disclosure. As shown in FIG. 7, this embodiment provides a display apparatus 91, which includes a display substrate 910. The display substrate 910 is the display substrate provided in the aforementioned embodiments. Herein, the display substrate 910 may be an OLED display substrate. The display apparatus 91 may be any product or component with a display function, such as an OLED display apparatus, a watch, a mobile phone, a tablet computer, a television, a display, a notebook computer, a digital photo frame, and a navigator. However, this embodiment is not limited to this.

The drawings of the present disclosure only involve the structures involved in the present disclosure, and other structures may refer to conventional designs. The embodiments of the present disclosure, and features in the embodiments may be combined with each other to obtain new embodiments in a case of no conflict.

Those of ordinary skill in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
a display region and a non-display region, wherein the non-display region is provided with a gate drive circuit comprising a plurality of cascaded shift register units; each shift register unit comprises an input sub-circuit and a denoising output sub-circuit; the denoising output sub-circuit is connected with the input sub-circuit, a first group of clock signal lines, and a second group of clock signal lines, and the input sub-circuit is connected with a third group of clock signal lines;
the third group of clock signal lines, the input sub-circuit, the first group of clock signal lines, the denoising output sub-circuit, and the second group of clock signal lines are sequentially arranged along a first direction;
the denoising output sub-circuit comprises: a denoising control unit; the first group of clock signal lines comprises a first clock signal line and a second clock signal line;
the denoising control unit at least comprises a first transistor, a second transistor, a first capacitor, and a second capacitor; a control electrode and a first electrode of the first transistor are connected with a second denoising control node, and a second electrode of the first transistor is connected with a first denoising control node; a control electrode of the second transistor is connected with the first clock signal line, a first electrode of the second transistor is connected with a first power supply line, and a second electrode of the second transistor is connected with the second denoising control node; a first electrode of the first capacitor is connected with the second denoising control node, a second electrode of the first capacitor is connected with the second clock signal line; a first electrode of the second capacitor is connected with the first denoising control node, and a second electrode of the second capacitor is connected with the first power supply line; and
the first capacitor is adjacent to the first transistor, and the second capacitor is adjacent to the first transistor.

2. The display substrate according to claim 1, wherein the second transistor is located on a side of the first capacitor away from the first transistor.

3. The display substrate according to claim 2, wherein
the denoising control unit further comprises a third transistor and a fourth transistor;
a control electrode of the third transistor is connected with a first output terminal of the input sub-circuit, a first electrode of the third transistor is connected with a second power supply line, and a second electrode of the third transistor is connected with the second denoising control node;
a control electrode of the fourth transistor is connected with the first output terminal of the input sub-circuit, a first electrode of the fourth transistor is connected with the second power supply line, and a second electrode of the fourth transistor is connected with the first denoising control node;
the third transistor and the fourth transistor are located on a side of the second transistor away from the first capacitor.

4. The display substrate according to claim 1, wherein the first capacitor and the second capacitor are located on opposite sides of the first transistor in the first direction respectively, and the first clock signal line, the second clock signal line, and the first power supply line all extend along a second direction, and the first direction and the second direction are intersected.

5. The display substrate according to claim 4, wherein an active layer of the first transistor extends along the first direction and an active layer of the second transistor extends along the second direction.

6. The display substrate according to claim 4, wherein the denoising control unit further comprises a third transistor and a fourth transistor;
a control electrode of the third transistor is connected with a first output terminal of the input sub-circuit, a first electrode of the third transistor is connected with a second power supply line, and a second electrode of the third transistor is connected with the second denoising control node;
a control electrode of the fourth transistor is connected with the first output terminal of the input sub-circuit, a first electrode of the fourth transistor is connected with the second power supply line, and a second electrode of the fourth transistor is connected with the first denoising control node;
the third transistor and the fourth transistor are located on a side of the second transistor away from the first capacitor.

7. The display substrate according to claim 1, wherein the first clock signal line is located on a side of the second clock signal line away from the input sub-circuit.

8. The display substrate according to claim 1, wherein the denoising control unit further comprises a third transistor and a fourth transistor;
a control electrode of the third transistor is connected with a first output terminal of the input sub-circuit, a first electrode of the third transistor is connected with a second power supply line, and a second electrode of the third transistor is connected with the second denoising control node;

a control electrode of the fourth transistor is connected with the first output terminal of the input sub-circuit, a first electrode of the fourth transistor is connected with the second power supply line, and a second electrode of the fourth transistor is connected with the first denoising control node;

the third transistor and the fourth transistor are located on a side of the second transistor away from the first capacitor.

9. The display substrate according to claim 8, wherein an extending direction of an active layer of the fourth transistor, an extending direction of an active layer of the third transistor, and an extending direction of an active layer of the second transistor are parallel to each other.

10. The display substrate according to claim 8, wherein the control electrode of the third transistor and the control electrode of the fourth transistor form an integrated structure, and an active layer of the third transistor and an active layer of the second transistor form an integrated structure.

11. The display substrate according to claim 8, wherein in a direction perpendicular to the display substrate, the display substrate comprises: a base substrate, and a semiconductor layer, a first conductive layer, a second conductive layer, a third conductive layer, and a fourth conductive layer that are arranged on the base substrate;

the semiconductor layer at least comprises active layers of the first transistor to fourth transistor;

the first conductive layer at least comprises control electrodes of the first transistor to fourth transistor, a first sub-electrode of the first capacitor, and a first sub-electrode of the second capacitor;

the second conductive layer at least comprises a second sub-electrode of the first capacitor and a second sub-electrode of the second capacitor;

the third conductive layer at least comprises a third sub-electrode of the first capacitor, a third sub-electrode of the second capacitor, first electrode and second electrode of the first transistor to fourth transistor, a first connection line, a second connection line, and a third connection line;

the fourth conductive layer at least comprises a fourth sub-electrode of the first capacitor, a fourth sub-electrode of the second capacitor, the first clock signal line connected with the first connection line, the second clock signal line connected with the second connection line, and the first power supply line connected with the third connection line;

the first sub-electrode and the third sub-electrode of the first capacitor are connected as a first electrode of the first capacitor and the second sub-electrode and the fourth sub-electrode of the first capacitor are connected as a second electrode of the first capacitor;

the first sub-electrode and the third sub-electrode of the second capacitor are connected as a first electrode of the second capacitor, and the second sub-electrode and the fourth sub-electrode of the second capacitor are connected as a second electrode of the second capacitor.

12. The display substrate according to claim 11, wherein the control electrode of the first transistor and the first sub-electrode of the first capacitor form an integrated structure, the first electrode of the first transistor and the third sub-electrode of the first capacitor form an integrated structure, and the second electrode of the first transistor and the third sub-electrode of the second capacitor form an integrated structure.

13. The display substrate according to claim 11, wherein the fourth sub-electrode of the second capacitor and the first power line form an integrated structure.

14. The display substrate according to claim 8, wherein the denoising output sub-circuit further comprises an output unit; and the second group of clock signal lines comprises a fifth clock signal line;

the output unit at least comprises a fifth transistor and a sixth transistor; a control electrode of the fifth transistor is connected with the first denoising control node, a first electrode of the fifth transistor is connected with the first power supply line, and a second electrode of the fifth transistor is connected with a second output terminal; a control electrode of the sixth transistor is connected with the input sub-circuit, a first electrode of the sixth transistor is connected with the fifth clock signal line, and a second electrode of the sixth transistor is connected with the second output terminal;

the fifth transistor and the sixth transistor are located between the fourth transistor and the second capacitor.

15. The display substrate according to claim 14, wherein the display substrate is provided with at least a first first power supply line and a second first power supply line, wherein the first first power supply line is connected with the denoising output sub-circuit, and the second first power supply line is connected with the input sub-circuit; the first first power supply line is located on a side of the second capacitor away from the first transistor, and the fifth clock signal line is located on a side of the first first power supply line away from the second capacitor.

16. The display substrate according to claim 1, wherein the first electrode and the control electrode of the first transistor are connected, and an orthogonal projection of the first electrode of the first transistor on a base substrate is not overlapped with an orthogonal projection of a channel region of an active layer of the first transistor on the base substrate.

17. A display apparatus, comprising the display substrate according to claim 1.

18. A preparation method for a display substrate, used for preparing the display substrate according to claim 1, the preparation method comprising:

providing a base substrate; and forming the gate drive circuit in the non-display region, wherein the gate drive circuit comprises the plurality of cascaded shift register units;

each shift register unit comprises the input sub-circuit and the denoising output sub-circuit; the denoising output sub-circuit is connected with the input sub-circuit, the first group of clock signal lines, and the second group of clock signal lines, and the input sub-circuit is connected with the third group of clock signal lines; and the third group of clock signal lines, the input sub-circuit, the first group of clock signal lines, the denoising output sub-circuit, and the second group of clock signal lines are sequentially arranged along the first direction.

19. The preparation method according to claim 18, wherein the denoising output sub-circuit comprises a denoising control unit; the first group of clock signal lines comprises a first clock signal line and a second clock signal line;

the denoising control unit at least comprises a first transistor, a second transistor, a third transistor, a fourth transistor, a first capacitor, and a second capacitor;

a control electrode and a first electrode of the first transistor are connected with a second denoising control node, and a second electrode of the first transistor is connected with a first denoising control node; a control electrode of the second transistor is connected with the first clock signal line, a first electrode of the second transistor is connected with a first power supply line, and a second electrode of the second transistor is connected with the second denoising control node; a first electrode of the first capacitor is connected with the second denoising control node, a second electrode of the first capacitor is connected with the second clock signal line; a first electrode of the second capacitor is connected with the first denoising control node, and a second electrode of the second capacitor is connected with the first power supply line; a control electrode of the third transistor is connected with a first output terminal of the input sub-circuit, a first electrode of the third transistor is connected with a second power supply line, and a second electrode of the third transistor is connected with the second denoising control node; a control electrode of the fourth transistor is connected with the first output terminal, a first electrode of the fourth transistor is connected with the second power supply line, and a second electrode of the fourth transistor is connected with the first denoising control node;

forming the gate drive circuit comprises:

sequentially forming a first insulating layer and a semiconductor layer on the base substrate, wherein the semiconductor layer at least comprises active layers of the first transistor to the fourth transistor;

sequentially forming a second insulating layer and a first conductive layer, wherein the first conductive layer at least comprises the control electrodes of the first transistor to fourth transistor, a first sub-electrode of the first capacitor, and a first sub-electrode of the second capacitor;

sequentially forming a third insulating layer and a second conductive layer, wherein the second conductive layer at least comprises a second sub-electrode of the first capacitor and a second sub-electrode of the second capacitor;

sequentially forming a fourth insulating layer and a third conductive layer, wherein the third conductive layer at least comprises a third sub-electrode of the first capacitor, a third sub-electrode of the second capacitor, the first electrode and second electrode of the first transistor to fourth transistor, a first connection line, a second connection line, and a third connection line;

sequentially forming a fifth insulating layer, a sixth insulating layer, and a fourth conductive layer, wherein the fourth conductive layer at least comprises a fourth sub-electrode of the first capacitor, a fourth sub-electrode of the second capacitor, the first clock signal line connected with the first connection line, the second clock signal line connected with the second connection line, and the first power supply line connected with the third connection line;

wherein the first sub-electrode and the third sub-electrode of the first capacitor are connected as a first electrode of the first capacitor, and the second sub-electrode and the fourth sub-electrode of the first capacitor are connected as a second electrode of the first capacitor;

the first sub-electrode and the third sub-electrode of the second capacitor are connected as a first electrode of the second capacitor, and the second sub-electrode and the fourth sub-electrode of the second capacitor are connected as a second electrode of the second capacitor.

* * * * *